(12) United States Patent
Kitamura et al.

(10) Patent No.: US 9,448,337 B2
(45) Date of Patent: Sep. 20, 2016

(54) ROD LENS ARRAY AND IMAGE SENSOR HEAD THAT USES SAME

(71) Applicant: Mitsubishi Rayon Co., Ltd., Tokyo (JP)

(72) Inventors: Masafumi Kitamura, Otake (JP); Kikue Irie, Otake (JP); Yasushi Kawaharada, Otake (JP)

(73) Assignee: MITSUBISHI RAYON CO., LTD., Tokyo (JP)

( * ) Notice: Subject to any disclaimer, the term of this patent is extended or adjusted under 35 U.S.C. 154(b) by 200 days.

(21) Appl. No.: 14/388,319

(22) PCT Filed: Mar. 27, 2013

(86) PCT No.: PCT/JP2013/058987
§ 371 (c)(1),
(2) Date: Sep. 26, 2014

(87) PCT Pub. No.: WO2013/146873
PCT Pub. Date: Oct. 3, 2013

(65) Prior Publication Data
US 2015/0053844 A1   Feb. 26, 2015

(30) Foreign Application Priority Data

Mar. 30, 2012 (JP) ................ 2012-078862
Oct. 22, 2012 (JP) ................ 2012-232871

(51) Int. Cl.
G02B 3/00 (2006.01)
H01L 27/146 (2006.01)

(52) U.S. Cl.
CPC ............. *G02B 3/0037* (2013.01); *G02B 3/005* (2013.01); *H01L 27/14627* (2013.01)

(58) Field of Classification Search
CPC ................................................ G02B 3/0087
USPC ................................................ 359/652, 654
See application file for complete search history.

(56) References Cited

U.S. PATENT DOCUMENTS

| 5,959,783 A | 9/1999 | Kittaka et al. |
| 7,777,964 B2 | 8/2010 | Abe et al. |
| 2003/0043255 A1 | 3/2003 | Ogi et al. |

(Continued)

FOREIGN PATENT DOCUMENTS

| JP | H11-14803 A | 1/1999 |
| JP | 2000-035519 A | 2/2000 |
| JP | 2003-072145 A | 3/2003 |
| JP | 2003-139912 A | 5/2003 |
| WO | 2007/011013 A1 | 1/2007 |

OTHER PUBLICATIONS

International Search Report dated Jul. 2, 2013, issued in International Application PCT/JP2013/058987.

(Continued)

*Primary Examiner* — Thanh Luu
(74) *Attorney, Agent, or Firm* — Fitch, Even, Tabin & Flannery LLP

(57) ABSTRACT

The purpose of the present invention is to provide a rod lens array, which has a deep depth of focus and a small depth of focus spot. The present invention provides a rod lens array that is equipped with at least one line of rod lenses between two substrates, said line of rod lenses having a plurality of columnar rod lenses wherein the refractive index decreases toward the outer periphery from the center, said rod lenses being arranged in such a manner that the center axes of the rod lenses are substantially parallel to each other. The rod lens array is characterized in that the average value (DOFave) of the depth of focus (DOF) is at least 0.9 mm, and the depth of focus spot (DOFcv) in the scanning direction of the line of rod lenses is not more than 12%.

4 Claims, 16 Drawing Sheets

(56) References Cited

U.S. PATENT DOCUMENTS

2007/0229965 A1* 10/2007 Yamamura ........... G02B 3/0006
  359/654
2009/0257128 A1 10/2009 Abe et al.

OTHER PUBLICATIONS

Written Opinion dated Jul. 2, 2013, issued in International Application PCT/JP2013/058987.

* cited by examiner

ROD LENS ARRAY AND IMAGE SENSOR HEAD THAT USES SAME

CROSS-REFERENCE TO RELATED APPLICATIONS

This Application is a U.S. National Stage Application filed under 35 U.S.C. §371 of International Application PCT/JP2013/058987, filed Mar. 27, 2013, designating the United States, which claims priority from Japanese Patent Application 2012-078862, filed Mar. 30, 2012, Japanese Patent Application 2012-232871, filed Oct. 22, 2012, the complete disclosures of which are hereby incorporated herein by reference in their entirety for all purposes.

TECHNICAL FIELD

The present invention relates to a rod lens array and an image sensor that uses the same. In more detail, the present invention relates to a rod lens array installed in an image sensor used in a flat-head-type scanner used in photocopying machines and the like, a hand scanner, etc., and an image sensor head equipped with such a rod lens array.

BACKGROUND ART

As one microlens, a rod lens in which both end faces of a columnar body that can be made of glass or a plastic material are mirror polished has been known. In addition to being used individually, rod lenses are also used in the form of a rod lens array in which a plurality of rod lenses are adhesively fixed to be arranged in parallel in one line or a plurality of lines.

Such rod lens arrays are widely employed as optical devices for reading for image sensors installed in various scanners such as hand scanners, or photocopying machines, facsimile machines, etc.

Photocopying machines have been advancing in colorization; therefore, the optical performance adapted to the reading of color images has been demanded also in rod lens arrays, which are optical devices for the built-in image sensors.

Then, in recent years, models that handle color images have been developed also for compact scanners such as hand scanners and flathead-type scanners, and also in such scanners, optical performance adapted to the reading of color images has been demanded in rod lens arrays, which are optical devices for built-in image sensors.

In order to respond to such demand, for example, a rod lens excelling in color characteristics has been developed that can obtain a color image with little chromatic aberration and little bleeding (Patent Document 1).

However, hand scanners, flathead-type scanners used in photocopying machines, etc. differ from facsimile machines, sheet-feed type scanners, etc., and the original document face is not fixed; therefore, the original floats during image reading, the distance between the lens surface of the rod lens and the original document face varies, and focusing the image may not be possible.

For this reason, for hand scanners, flathead-type scanners, etc. used in photocopying machines and the like, rod lenses of deep depth of focus have been demanded so that a clear image is obtained even if the distance between the lens face of the rod lens and the original document face somewhat varies.

Furthermore, in addition to colorization of images, the miniaturization of devices is advancing, and thus rod lenses that can realize compact optical systems have been demanded.

Generally, since the depth of focus and numerical aperture of lenses are in an inverse proportional relationship, it is possible to obtain a rod lens of deep depth of focus by decreasing the numerical aperture. However, since the conjugation length becomes longer as the numerical aperture decreases, it becomes difficult to achieve miniaturization of the optical system.

In order to deal with such a situation, Patent Document 2 discloses a rod lens that reduces the numerical aperture by decreasing the effective diameter of the lens by providing a light absorption layer having a thickness of at least 50 μm at the lens outer periphery, thereby shortening the conjugation length, and deepening the depth of focus.

Furthermore, Patent Document 3 discloses a rod lens with deepened depth of focus by setting a refractive index distribution constant g of the rod lens to $0.2 \text{ mm}^{-1} \leq g \leq 0.325 \text{ mm}^{-1}$, and setting the product of g and the rod lens radius r to $0.04 \leq g \cdot r < 0.065$.

[Patent Document 1] Pamphlet of PCT International Publication No. WO2007/011013

[Patent Document 2] Japanese Unexamined Patent Application, Publication No. 2000-35519

[Patent Document 3] Japanese Unexamined Patent Application, Publication No. 2003-139912

DISCLOSURE OF THE INVENTION

Problems to be Solved by the Invention

However, since the depth of focus is shallow in the rod lens described in Patent Document 1, there has been a problem in that it has not been possible to configure a rod lens array having a deep depth of focus.

With the rod lens disclosed in Patent Document 2, the numerical aperture decreases as the light absorption layer thickens, and thus the depth of focus deepens; however, the occupied proportion of the light absorption layer relative to the lens diameter increases as the light absorption layer thickens. For this reason, upon preparing a rod lens array arranging such lenses, the portions serving as the lens function in the array will be separated even if aligning the lenses to be in close contact. As a result thereof, there have been problems in that irregularity in the depth of focus occurs in the lens array, and irregularity in the read image occurs in the state of the original floating.

Furthermore, with the rod lens disclosed in Patent Document 2, since the transmitted light amount as the lens array is insufficient, there has been a problem in that the light intensity irregularity increases, and streaked unevenness occurs.

The rod lens disclosed in Patent Document 3 can deepen the depth of focus by reducing the numerical aperture; however, it is not practical due to the light intensity being too small, and since the conjugation length is long, it has been difficult to incorporate into a miniaturized image sensor.

In the rod lens disclosed in Patent Document 3, similarly to the lens disclosed in Patent Document 2, the light absorption layer is thick, and thus there have been problems in that the irregularity in the depth of focus arises in the lens array when made into a rod lens array, and irregularity arises in the read image in a state of the original floating. Furthermore, with the rod lens disclosed in Patent Document 3, since the transmitted light amount as the lens array is insufficient, there has been a problem in that the light intensity irregularity increases, and streaked unevenness occurs.

The present invention has been made taking the above-mentioned situation into consideration, and has an object of providing a rod lens array having deep depth of focus and little depth-of-focus irregularity. The present invention also has an object of providing a rod lens array with short conjugation length, sufficiently large transmitted light amount, and little light intensity irregularity. Furthermore, the present invention has an object of providing an image sensor equipped with such a rod lens array, capable of clearly reading images even if the position of the read original shifts. In addition, the present invention has an object of providing an image sensor for which read images are uniform, and that can suppress streaked unevenness.

Means for Solving the Problems

According to the present invention,

A rod lens array is provided that includes at least one line of rod lenses between two substrates, wherein a plurality of columnar rod lenses having a refractive index that decreases from the center towards an outer periphery is arranged so that a central axes of the rod lenses respectively are substantially parallel to each other, in which an average value DOFave of the depth of focus DOF is at least 0.9 mm, and a depth-of-focus irregularity DOFcv in a main scanning direction of the line of the rod lenses is no more than 12%.

Herein, depth of focus in the present specification is a length defined as the width of the movement range of the grid pattern at which the MTF is at least 40% when only the grid pattern is made to move by arranging a 6 Lp/mm grid pattern, rod lens and photoreceiving sensor so that the MTF for light of a wavelength of 525 nm becomes a maximum. In addition, in the present specification, the evaluation of optical performance is the optical performance for light having a wavelength of 525 nm, unless otherwise particularly defined otherwise.

In addition, DOFcv is a value arrived at by dividing the standard deviation of the depth of focus in the main scanning direction of the lens array by DOFave.

According to another preferred aspect of the present invention, a lens array is provided that satisfies the requirements of formula (1) to (4) below, $$0.3 \text{ mm}^{-1} \leq g \leq 0.6 \text{ mm}^{-1} \quad (1)$$

$$0.1 \text{ mm} \leq r_e \leq 0.3 \text{ mm} \quad (2)$$

$$NA \leq 0.175 \quad (3)$$

$$0.85 \leq 2r_e/P \leq 1 \quad (4)$$

in which g represents a refractive index distribution constant of the rod lens, and $r_e$ represents a radius of an effective portion serving as a lens function of the rod lens, NA represents a numerical aperture of the rod lens, and P represents a distance between centers of adjacent rod lenses in the rod lens array.

According to another aspect of the present invention, an image sensor equipped with the above-mentioned rod lens array is provided.

Effects of the Invention

According to the present invention, it is possible to obtain a rod lens array having deep depth of focus and little depth-of-focus irregularity. In addition, according to the present invention, it is possible to obtain a rod lens array having short conjugation length, sufficiently large transmitted light amount, and little light intensity irregularity.

Furthermore, according to the present invention, it is possible to obtain an image sensor equipped with such a rod lens array that is capable of clearly reading an image even if the position of the read original shifts. Moreover, according to the present invention, it is possible to provide an image sensor for which read images are uniform and streaked unevenness is suppressed. Furthermore, since the rod lens array of the present invention can efficiently transmit the light of a light source, it can be expected to also curb electricity consumption.

PREFERRED MODE FOR CARRYING OUT THE INVENTION

Figure 1:
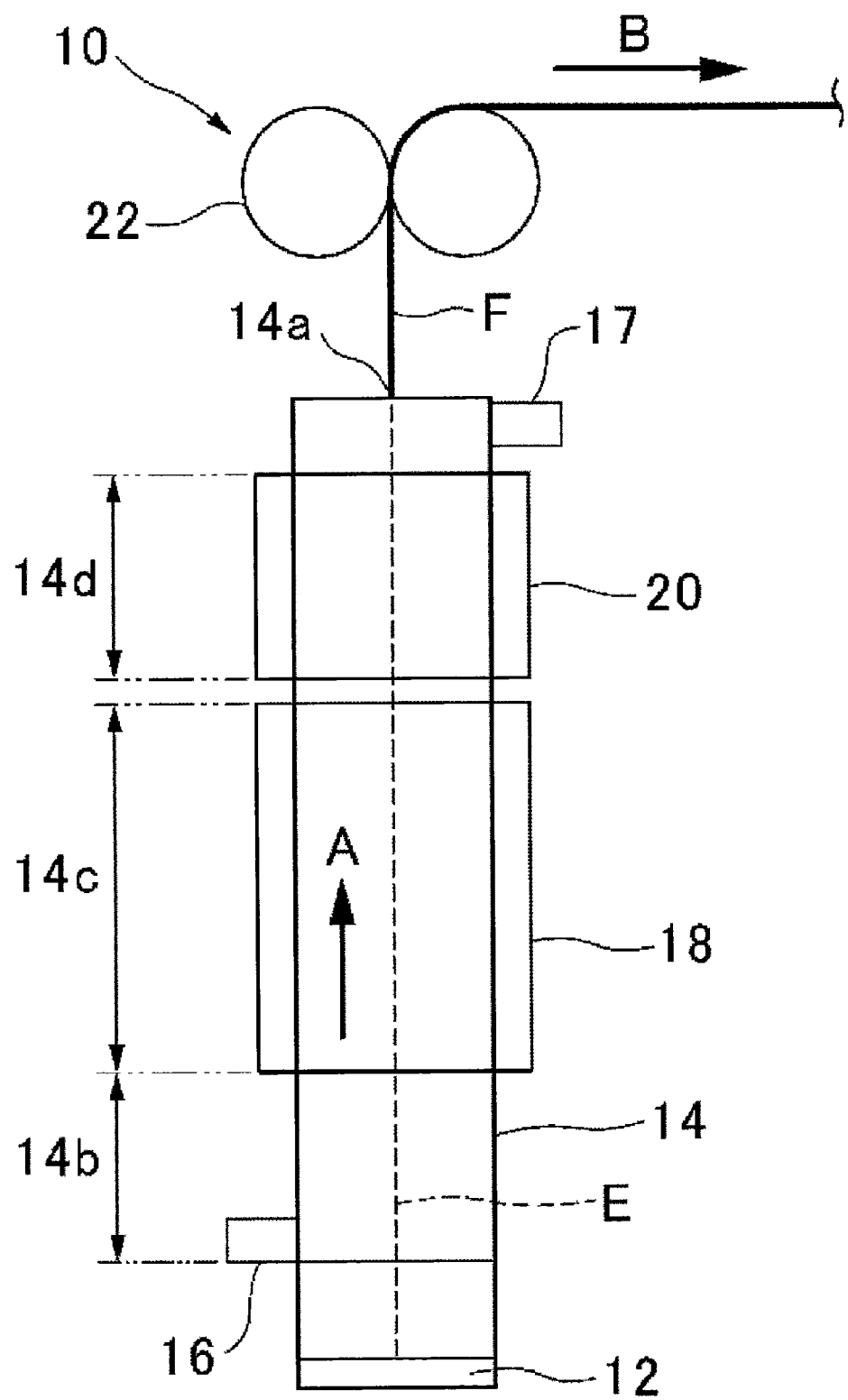
FIG. 1 is a view schematically showing the configuration of manufacturing equipment for manufacturing the base fiber of a rod lens used in a rod lens array of a preferred embodiment of the present invention.

Hereinafter, a rod lens array of a preferred embodiment of the present invention will be explained following the drawings.

Rod Lens

First, a rod lens used in a rod lens array of the embodiment will be explained.

The type of rod lens used in the present embodiment is not limited, and can be appropriately selected depending on the intended use, etc. For example, in the present invention, a rod lens made of glass can be used, and a rod lens made of plastic can also be used. Due to easy handleability and low cost, it is preferable to use plastic rod lenses in the present invention.

The rod lenses used in the present embodiment have a columnar shape, and the refractive index n continuously decreases from the central axis to the outer peripheral face. In more detail, the rod lenses used in the present embodiment are lenses having a distribution of refractive indices n in the range of 0.2r to 0.9r (provided that r is the radius of a cross-section of the rod lens) from the central axis approximated as a quadratic curve defined by Formula (5) below.

$$n(L)=n_0\{1-(g^2/2)L^2\} \tag{5}$$

(n(L) represents the refractive index at a position a distance L in the radial direction from the central axis of the rod lens, $n_0$ represents the refractive index at the central axis in the radial direction of the rod lens, L represents a distance in the radial direction from the center in the radial direction of the rod lens ($0 \leq L \leq r$), and g represents a refractive index distribution constant of the rod lens).

The refractive index distribution constant g is a second-order coefficient related to the position L of the refractive index distribution curve approximated by the above-mentioned formula, and is a constant defining the slope of the refractive index distribution curve. In other words, in the above Formula (1), with larger g, the refractive index distribution curve becomes a steeper shape, which means the decrease in the refractive index from the central axis to the outer peripheral face inside the rod lens is sudden.

It should be noted that, in the present specification, "cross-section" of the rod lens means the cross-section when cutting the rod lens in a perpendicular direction to the central axis line.

In the rod lens used in the present embodiment, the value of the refractive index $n_0$ at the center in the radial direction is not particularly limited; however, it preferably satisfies the formula below.

$$1.45 \leq n_0 \leq 1.65$$

When the refractive index $n_0$ is in this range, since the options for materials that can be used in the rod lens broaden, it is preferable in being able to obtain a rod lens having good refractive index distribution and superior transparency.

The refractive index distribution constant g of the rod lens used in the present embodiment satisfies formula (1) below.

$$0.3 \text{ mm}^{-1} \leq g \leq 0.6 \text{ mm}^{-1} \tag{1}$$

Due to recent demand for reduction in the size of equipment, the thickness of the platen glass of an image scanner in which a rod lens array is incorporated has become on the order of no more than 3 mm.

When considering that floating of the focal point (about −1 mm) arising from the platen glass having a thickness of 3 mm and the clearance between the platen glass and the lens end face (preferably at least 1 mm), it is necessary for the working distance $L_0$ of the rod lens to be at least 3 mm, and by setting the refractive index distribution constant g to no more than 0.6 mm$^{-1}$, it is possible to make the working distance of the rod lens at least 3 mm.

In addition, by setting the refractive index distribution constant g to no more than 0.6 mm$^{-1}$, the numerical aperture NA represented by the product of $n_0$ multiplied by g multiplied by $r_e$ as described later can be set small, whereby the depth of focus can be made deep.

Furthermore, by setting the refractive index distribution constant g to at least 0.3 mm$^{-1}$, the working distance $L_0$ will not be too long, and the equipment overall can be reduced in size, as well as being able to set the numerical aperture NA represented by the product of $n_0$ multiplied by g multiplied by $r_e$ as described later to be large, whereby the light intensity can be increased.

The lower limit value for the refractive index distribution constant g is preferably at least 0.35 mm$^{-1}$, and the upper limit value for the refractive index distribution constant g is preferably no more than 0.5 mm$^{-1}$.

The radius r of the rod lens used in the present embodiment preferably satisfies formula (6) below.

$$0.1 \text{ mm} \leq r \leq 0.3 \text{ mm} \tag{6}$$

By setting the radius r to no more than 0.3 mm, it is possible to set the numerical aperture NA to be small, whereby the depth of focus can be made deep.

By setting the radius r to at least 0.1 mm, the processability and handleability upon manufacturing the rod lens array of the present embodiment improve. The lower limit value for the radius r is preferably at least 0.15 mm.

Furthermore, the rod lenses used in the present embodiment have an effective radius $r_e$, which is the radius of an effective portion serving as the lens function, satisfying formula (2) below.

$$0.1 \text{ mm} \leq r_e \leq 0.3 \text{ mm} \tag{2}$$

By setting the effective radius $r_e$ to no more than 0.3 mm, it is possible to set the numerical aperture NA to be small, whereby the depth of focus can be made deep.

By setting the effective radius $r_e$ to at least 0.1 mm, upon configuring the rod lens array of the present embodiment, and an optical system such as an image sensor to which this rod lens array is incorporated, shifting between the optical axis of the rod lens and the optical axis of the light source or photodetecting sensor hardly occurs, and thus it is possible to reduce the decline in optical characteristics accompanying this.

In addition, by setting the effective radius $r_e$ to at least 0.1 mm, it is possible to set the numerical aperture NA to be large, whereby the light intensity can be increased. The preferred range of effective radius $r_e$ is at least 0.15 mm to no more than 0.25 mm, and is more preferably at least 0.16 to no more than 0.245. Although the radius r and effective radius $r_e$ may be the same values, they are preferably $r_e \leq r$, and the relationship of $0.85r \leq r_e \leq r$ is more preferable.

The numerical aperture NA of the rod lenses used in the present embodiment satisfies formula (3) below.

$$NA \leq 0.175 \tag{3}$$

By setting the numerical aperture NA to within this range, the depth of focus DOF having an inverse proportional relationship with the numerical aperture NA can be made deep. From the viewpoint of making the depth of focus deep, the upper limit value for NA is preferably no more than 0.15.

In addition, from the viewpoint of increasing the light intensity, the lower limit value for NA is preferably at least 0.06, and is more preferably at least 0.1.

Rod Lens Manufacture

Next, a manufacturing method for producing the rod lens of the present embodiment will be explained. Although the type of rod lens used in the present embodiment is not limited, a representative rod lens made of plastic will be mentioned herein.

A plastic rod lens of the present embodiment has a refractive index that decreases from the center towards the outer circumference. As methods for manufacturing such a plastic rod lens, for example, an addition reaction method, a copolymerization method, a gel polymerization method, a monomer volatilization method, an interdiffusion methods and the like are known; however, thereamong, the interdiffusion method is preferable in the points of precision and productivity.

Hereinafter, the interdiffusion method will be explained.

First, N-types of uncured form materials having the refractive index n after curing of $n_1 > n_2 > \ldots > n_N$ ($N \geq 3$) are formed into a laminate (hereinafter referred to as "filament") of uncured form laminated concentrically so that the refractive index sequentially becomes lower from the center towards the outer circumference, for example, using a composite spinning nozzle or the like.

Next, so that the refractive index distribution between each layer of this filament becomes continuous, while performing interdiffusion processing to cause the substances to interdiffuse between adjacent layers, or after performing interdiffusion processing, the filament is cured to obtain a rod lens base fiber (spinning process). Herein, the interdiffusion processing is processing imparting a thermal history to the filament of between several seconds to several minutes at 10 to 60° C., more preferably 20 to 50° C., under a nitrogen environment.

Next, after conducting heating and drawing as necessary on the rod lens base fiber obtained by the above-mentioned spinning process, by conducting relaxation processing, and cutting to a predetermined length as appropriate, a rod lens is obtained.

The uncured form material can employ a composition or the like including a radical-polymerizable monomer and a polymer (soluble polymer) that is soluble in this monomer. By including the soluble polymer, moderate viscosity is imparted to the uncured form material, facilitating spinning.

As specific examples of the radical-polymerizable vinyl monomers, methyl methacrylate (n=1.49); styrene (n=1.59); chlor-styrene (n=1.61); vinyl acetate (n=1.47); fluorinated alkyl (meth)acrylates such as 2,2,3,3-tetrafluoropropyl (meth)acrylate, 2,2,3,3,4,4,5,5-octafluoropentyl (meth)acrylate, 2,2,3,4,4,4-hexafluorobutyl (meth)acrylate and 2,2,2-trifluoroethyl (meth)acrylate (n=1.37 to 1.44); (meth)acrylates having a refractive index of 1.43 to 1.62 such as ethyl (meth)acrylate, phenyl (meth)acrylate, benzyl (meth)acrylate, hydroxyalkyl (meth)acrylate, alkylene glycol (meth) acrylate, trimethylolproprane di or tri(meth)acrylate, pentaerythritol di, tri or tetra(meth)acrylate, diglycerin tetra (meth)acrylate and dipentaerythritol hexa(meth)acrylate; diethylene glycol bisallyl carbonate; fluorinated alkylene glycol poly(meth)acrylate; various (meth)acrylates having alicyclic groups; etc. can be exemplified.

As the soluble polymer, polymethyl methacrylate (n=1.49, Tg=114° C.), polymethyl methacrylate copolymer (n=1.47 to 1.5), etc. can be exemplified. Thereamong, polymethyl methacrylate (PMMA) is preferable from the viewpoint of superior transparency and high refractive index in itself. It should be noted that the numerical values within the parenthesis are physical properties.

To cure the filament formed from the uncured form materials, a thermosetting catalyst and/or a photocuring catalyst may be added to the uncured form materials, and thermosetting processing and/or photocuring processing may be performed.

The thermosetting processing can be performed by heat treating for a predetermined time the uncured form materials including the thermosetting catalyst by a cure processing unit such as a heating furnace controlled at a fixed temperature.

The photocuring processing can be performed by irradiating ultraviolet light from the surroundings of the uncured form materials including the photocuring catalyst. As the light source used in the photocuring processing, a carbon arc lamp, an ultrahigh pressure mercury lamp, a high pressure mercury lamp, a medium pressure mercury lamp, a low pressure mercury lamp, a chemical lamp, a xenon lamp, light-emitting diodes (LED), laser light or the like generating light of a wavelength of 150 to 600 nm can be exemplified.

As the thermosetting catalyst, a peroxide-based or azo-based catalyst, or the like is used.

As the photocuring catalyst, for example, benzophenone, benzoin alkylether, 4'-isopropyl-2-hydroxy-2-methylpropiophenone, 1-hydroxycyclohexyl phenyl ketone, benzyl methyl ketal, 2,2-diethoxyacetophenone, chlorothioxanthone, thioxanthone-based compounds, benzophenone-based compounds, ethyl 4-dimethyl aminobenzoate, isoamyl 4-dimethyl aminobenzoate, N-methyldiethanolamine, triethylamine, etc. can be exemplified.

The added amount of this thermosetting catalyst or photosetting catalyst is preferably 0.01 to 2% by mass in 100% by mass of the uncured form material.

In addition, to stably manufacture the filament, 10 to 1000 ppm of a polymerization inhibitor is preferably added into the uncured form material in order to prevent polymerization until the curing processing.

As the polymerization inhibitor, for example, quinone compounds such as hydroquinone and hydroquinone monomethyl ether; amine-based compounds such as phenothiazine; N-oxyl-based compounds such as 4-hydroxy-2,2,6,6-tetramethylpiperidine-N-oxyl, etc. can be exemplified.

The rod lenses used in the rod lens array of the present embodiment may have an absorption layer formed containing an absorbent that absorbs at least a part of the light transmitting through the rod lens, in the range of 0.90r to r (outer peripheral part) from the center to outer circumference.

Generally, with a rod lens, an irregular portion in which the refractive index distribution departs from the ideal distribution tends to be formed as distancing from the center; however, it is possible to suppress the decline in optical characteristics caused by the irregular portion of the refractive index distribution so long as a light absorption layer is formed at the outer peripheral part of the rod lens.

The thickness of the light absorption layer is preferably 0 to 50 μm. By setting the thickness of the light absorption layer to this range, flare light and crosstalk light can be sufficiently eliminated, along with being able to ensure sufficient transmitted light volume.

In order to cause polymerization curing by a photopolymerization method, it is necessary to allow light for photopolymerization to permeate the uncured form material layers. However, there are many kinds of light absorbers, and there are various wavelength dependences of light absorption. In other words, light absorbers also exist that absorb transmitted light of a rod lens, as well as absorbing at least an equivalent amount of light as that used in polymerization. Therefore, in a case of polymerization curing processing by the photopolymerization method, it is desirable to use light absorbers having a characteristic absorbing the transmitted light of the rod lens, but not absorbing the light for polymerization as much as possible and allowing permeate.

The light actually used as the transmitted light by the rod lens normally is light having a wavelength of 400 to 750 nm in the range from visible light to the near-infrared light. On the other hand, the emission wavelength of light used in photopolymerization is 300 to 370 nm ultraviolet light, normally. Therefore, it is preferable to use light absorbers having an absorbance coefficient in the wavelength region of 400 to 750 nm that is at least twice of absorbance coefficient for 300 to 370 nm.

As such a light absorber, for example, "Kayasorb CY-10" manufactured by Nippon Kayaku Co., Ltd., which absorbs 600 nm to the near-infrared region, "Diaresin Blue 4G" manufactured by Mitsubishi Chemical Corp., which absorbed 600 to 700 nm, "Kayaset Blue ACR" manufactured by Nippon Kayaku Co., Ltd., which absorbs 550 to 650 nm, "MS Magenta HM-1450" manufactured by Mitsui Toatsu Dye Ltd., which absorbs 500 to 600 nm, "MS Yellow HD-180" manufactured by Mitsui Toatsu Dye Ltd., which absorbs 400 to 500 nm, etc. can be exemplified.

In addition, as a light absorber that absorbs light in the full spectrum of 400 to 750 nm, it is possible to exemplify black dyes, etc. These light absorbers may be used independently, or can also be used by combining two or more.

The above-mentioned spinning process, for example, can be performed using rod lens base fiber manufacturing equipment like that shown in FIG. 1.

This rod lens base fiber manufacturing equipment 10 is the same structure as conventional composite spinning equipment, and includes a concentric composite spinning nozzle 12, a cylindrical storage body 14 inside which filaments discharged from the composite spinning nozzle 12 are conveyed, an inert gas introduction pipe 16 that is connected to a composite spinning nozzle 12 side of the storage body 14 and supplies inert gas (e.g., nitrogen gas) into the storage body 14, and an inert gas discharge pipe 17 that is connected to an outlet 14a side of the storage body 14 and discharges inert gas from the storage body 14.

The rod lens base fiber manufacturing equipment 10 further includes a first photoirradiation device 18 that is provided to an outer side from the center in the longitudinal direction of the storage body 14 and irradiates ultraviolet light to a filament E, a second photoirradiation device 20 that is provided at a downstream-side position of the first photoirradiation device 18 of the storage body 14 and irradiates ultraviolet light to the filament E, and a pair of receiving rollers 22 arranged on the downstream side of the storage body 14.

In the storage body 14, a region from the composite spinning nozzle 12 until immediately before ultraviolet light from the first photoirradiation device 18 is irradiated on the filament E is referred to as a interdiffusion processing part 14b, a region in which ultraviolet light from the first photoirradiation device 17 is irradiated on the filament E is referred to as a first cure processing part 14c, and a region in which ultraviolet light from the second photoirradiation device 20 is irradiated on the filament E is referred to as a second cure processing part 14d.

In the manufacturing of the rod lens base fiber using the manufacturing equipment 10, inert gas (for example, nitrogen gas) is introduced into the storage body 14 from the inert gas introduction pipe 16 and inert gas in the storage body 14 is discharged from the inert gas discharge pipe 17 during manufacture of the rod lens base fiber.

While flowing inert gas inside of the storage body 14, N number of uncured form materials in which the refractive index n after curing is $n_1 > n_2 > \ldots > n_N$ ($N \geq 3$) are concentrically sprayed from the composite spinning nozzle 12 in an arrangement such that the refractive index sequentially decreases from the center towards the outer periphery, the filament E, which is a laminate of uncured form, is fed into the storage body 14, and made to pass through the inside of the storage body 14 as shown by the arrow A.

Inside of the storage body 14, interdiffusion occurs between each layer constituting the filament E first in the interdiffusion processing part 14b. In the first cure processing part 14c, ultraviolet light is irradiated from the first photoirradiation device 18 to the filament E, and curing progresses while interdiffusing between respective layers. Furthermore, in the second cure processing part 14d, ultraviolet light is irradiated from the second photoirradiation device 20 to the filament E, and curing further progresses.

Then, by receiving the filament E by the receiving rollers 22, the rod lens base fiber F is drawn from the storage body 14. The rod lens base fiber F is further conveyed downstream as shown by the arrow B.

The rod lens base fiber F obtained in the spinning process is continuously sent to heating and drawing processing. However, the rod lens base fiber F obtained in the spinning process may be sent to heating and drawing processing after winding on a bobbin or the like.

Heating and drawing processing may be performed continuously, or may be performed by a batch method. Furthermore, heating and drawing processing and relaxation processing may be performed continuously, or may be performed discontinuously.

Figure 2:
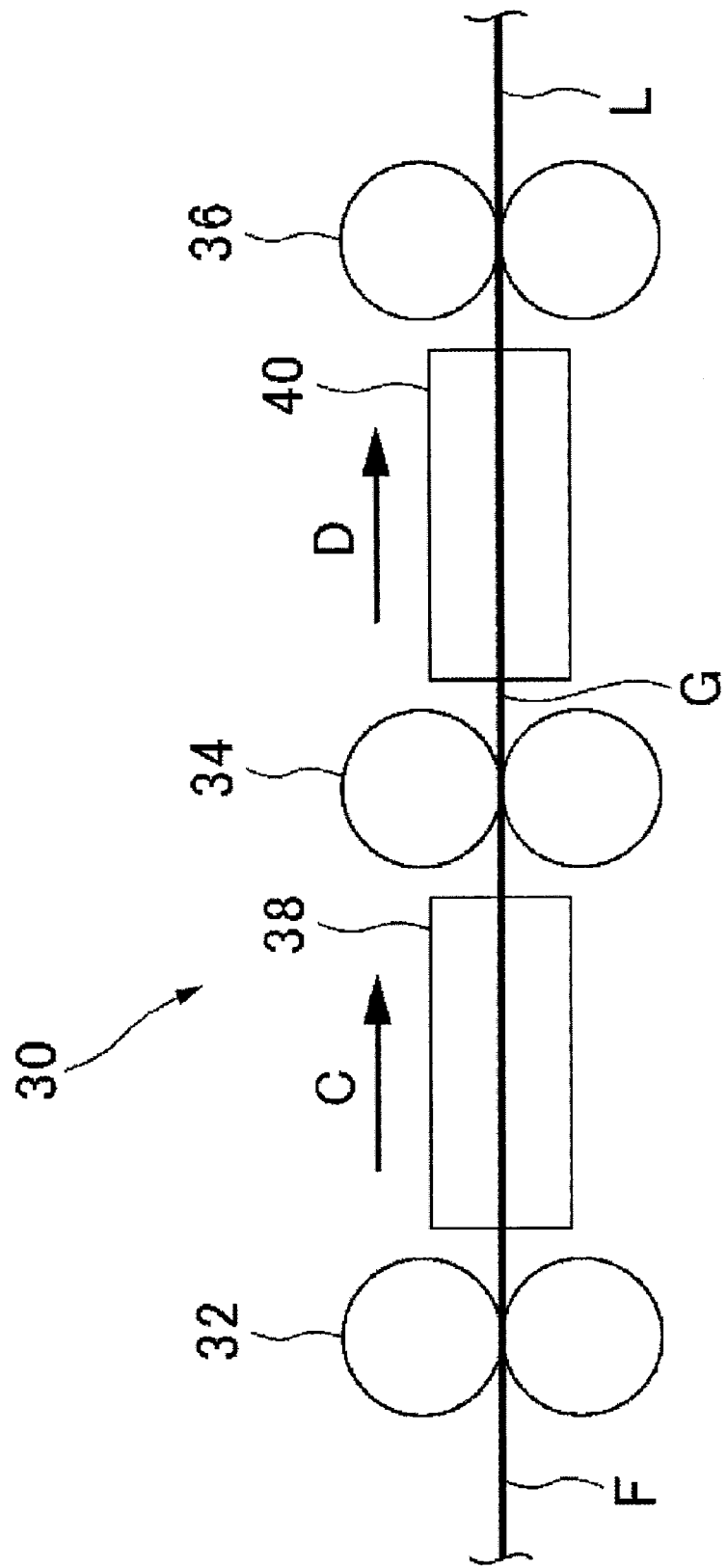
FIG. 2 is a view schematically showing the configuration of a drawing/relaxation processing equipment used during base fiber manufacturing for the rod lens used in the rod lens array of a preferred embodiment of the present invention.

Heating and drawing processing and relaxation processing are performed using drawing/relaxation processing equipment 30 like that shown in FIG. 2, for example.

To this drawing/relaxation processing equipment 30, a first nip roller 32, a second nip roller 34, and a third nip roller 36 are provided in order from an upstream side in the conveying direction of rod lens base fiber F. Furthermore, the drawing/relaxation processing equipment 30 includes a first heating oven 38 arranged between the first nip roller 32 and the second nip roller 34, and a second heating oven 40 arranged between the second nip roller 34 and third nip roller 36.

With the drawing/relaxation processing equipment 30, the rod lens base fiber F obtained by curing is supplied to the first heating oven 38 by way of the first nip roller 32, and the rod lens base fiber F having passed through the first heating oven 38 is received and drawn by the second nip roller 34 at a higher speed than the first nip roller 32, to become a drawn rod lens base fiber G.

The temperature of the atmosphere inside of the first heating oven 38 in the heating and drawing processing is set as appropriate depending on the materials of the rod lens, etc.; however, it is preferably at least the glass transition temperature (Tg) of the rod lens +20° C. In addition, the draw ratio is determined appropriately according to the desired rod lens diameter, and can be adjusted by the circumferential speed ratio of the first nip roller 32 and second nip roller 34.

The relaxation processing is also performed by the drawing/relaxation processing equipment 30. The drawn rod lens base fiber G is supplied to the second heating oven 40 by the second nip roller 34, and the rod lens base fiber G having pass through the second heating oven 40 is received and relaxed by the third nip roller 36 at a slower speed than the second nip roller 34 to become a relaxed rod lens base fiber L.

The temperature of the atmosphere inside of the second heating oven 40 for relaxation processing is set as appropriate depending on the materials of the rod lens, etc.; however, it is preferably at least the Tg of the rod lens. In addition, the relaxation ratio (length after relaxation processing/length before relaxation processing) is set as appropriate according to the desired rod lens diameter; however, it is preferably set so as to be on the order of 99/100 to 1/2.

When conducting relaxation processing at such a relaxation ratio, it is possible to suppress shrinkage of the rod lens. It should be noted that it is not preferable when the relaxation ratio is too small because the irregularity in the lens diameter increases. The relaxation ratio can be adjusted by the circumferential speed ratio of the second nip roller 34 and third nip roller 36.

According to the aforementioned method, a plurality of polymers overlap concentrically to make a polymer mixture, whereby a plastic rod lens is obtained having a refractive index distribution in which the refractive index continuously decreases from the center towards an outer periphery. It should be noted that this polymer mixture is cured in a state in which monomers constituting the polymer interdiffused between respective layers.

Figure 3:
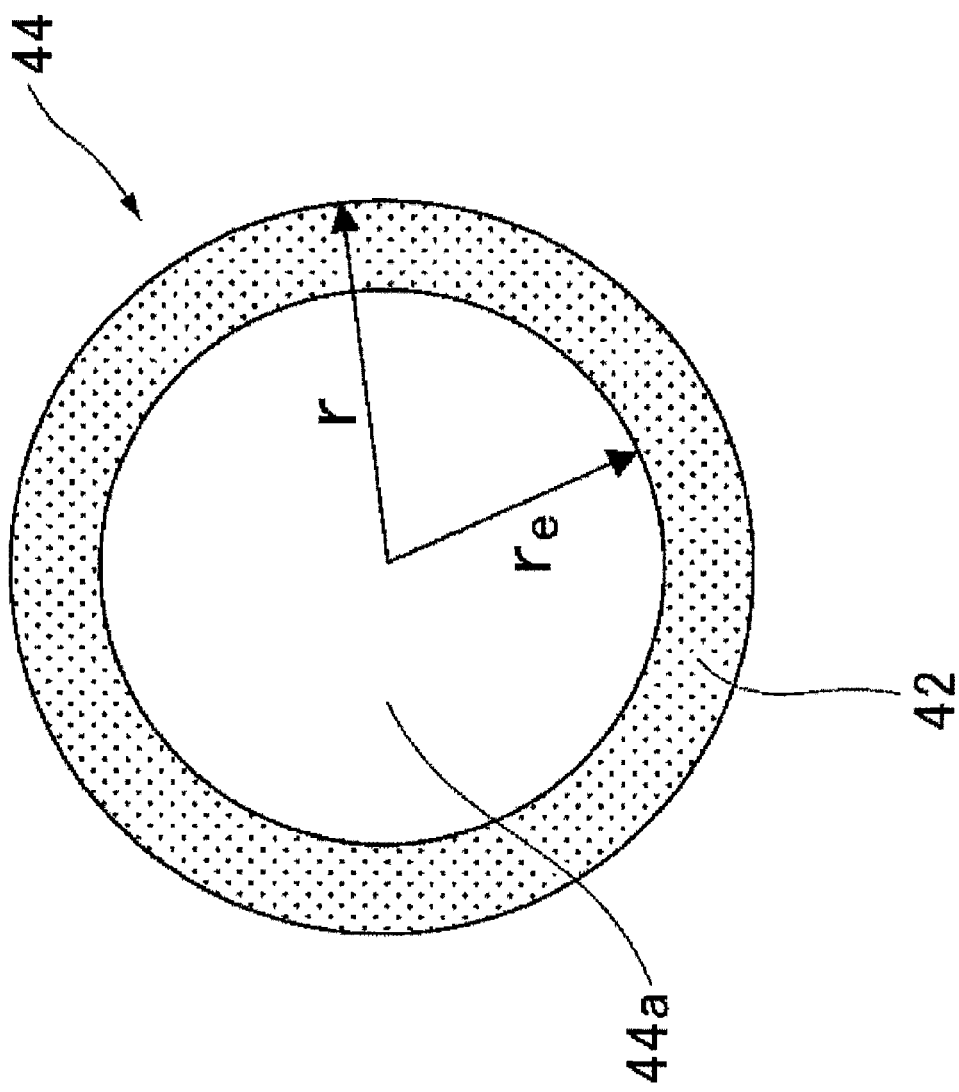
FIG. 3 is a cross-sectional view schematically showing the configuration of a rod lens used in the rod lens array of a preferred embodiment of the present invention.
Figure 4:
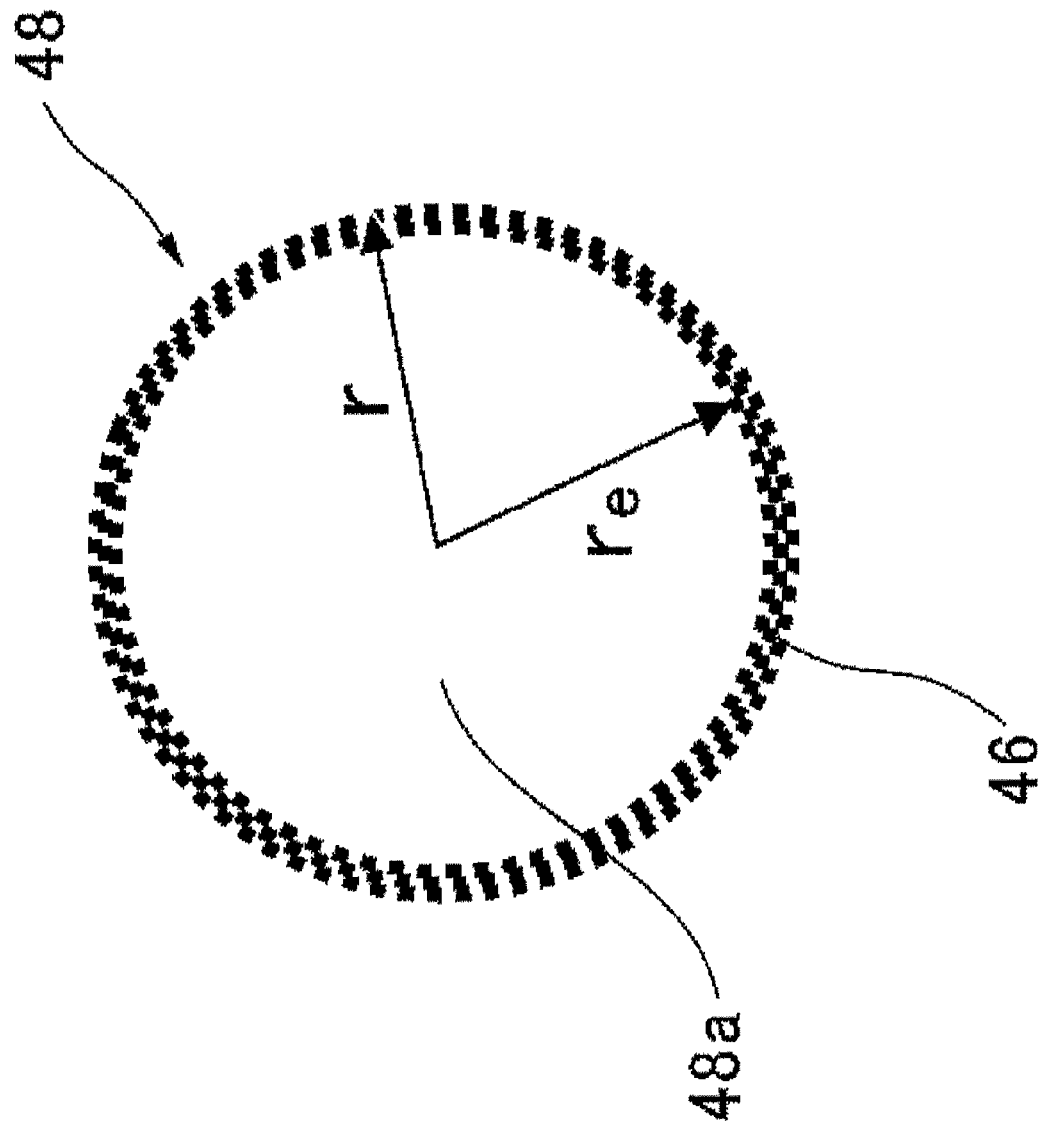
FIG. 4 is a cross-sectional view schematically showing another configuration of the rod lens used in the rod lens array of a preferred embodiment of the present invention.

The manufactured rod lens base fiber L is made the rod lens 44 in which a stained part 42 is provided at the outer peripheral part (FIG. 3) with the object such as eliminating flare light and crosstalk light. Alternatively, instead of the stained part 42, it may be made a rod lens 48 in which a roughened-surface part 46 is formed (FIG. 4). In either case, the radius $r_e$ of the effective portions 44$a$, 48$a$ serving as the lens function is smaller than the lens radius r.

The effective radius $r_e$, which is the radius of the effective portion serving as the lens function, is established so as to satisfy formula (2) below in the rod lenses 44, 48 by way of the stained part 42 or roughened-surface part 46.

$$0.1 \text{ mm} \leq r_e \leq 0.3 \text{ mm} \quad (2)$$

Furthermore, the numerical aperture NA is established in the rod lenses 44, 48 so as to satisfy formula (3) below.

$$NA \leq 0.175 \quad (3)$$

It should be noted that the lower limit value for NA is preferably at least 0.06, and more preferably at least 0.1.

Furthermore, the refractive index distribution constant g is established in the rod lenses 44, 48 so as to satisfy formula (1) below.

$$0.3 \text{ mm}^{-1} \leq g \leq 0.6 \text{ mm}^{-1} \quad (1)$$

Rod Lens Array

Next, a rod lens array of the present embodiment will be explained.

In a rod lens array 50 of the present embodiment, a plurality of the above-mentioned rod lenses 44 (48) are arranged to be aligned in one line, or two or more lines between two substrates 52, so that a central axis of the respective rod lenses 44 are substantially parallel with each other.

Although the material of the substrates 52 is not particularly limited, it is preferably a material for which processing in the processes of preparing the rod lens array is easy.

As this material, it is possible to use thermoplastic resins, heat-curable resins, etc. In more detail, acrylics resins, ABS resins, polyimide resins, liquid crystalline polymers, epoxy resins, phenol resins, etc. are preferable. In addition, the base material of the substrate 52 may employ fiber or paper as a reinforcing material, and may add a mold-release agent, dye, pigment, antistatic agent, etc. to the substrate.

The substrate 52 constituting the rod lens array 50 may be of planar form, or may be one in which U-shaped, V-shaped, etc. grooves that arrange and receive the rod lenses 44 are formed at fixed intervals therein.

In the space between the rod lenses 44 and substrate 42, an adhesive 54 is filled to adhesively fix the rod lenses 44 between the substrates 52. The type of the adhesive 54 is not particularly limited so long as having adhesive force of an extent that can fix between the rod lenses 44 and substrate 52, or between rod lenses 44, 44, and an adhesive that can be applied in the form of a thin film, a spray-type adhesive, hot-melt-type adhesive, or the like can be used.

As the application method of the adhesive 54 to the substrate 52 and/or rod lenses 44, a well-known coating method such as the screen printing method and spray coating method can be employed.

The array pitch P of the rod lenses 44 in the rod lens array used in the present embodiment satisfy formula (4) below.

$$0.85 \leq 2r_e/P \leq 1 \quad (4)$$

Herein, array pitch P is the distance between the centers of adjacent rod lenses in the rod lens array, and $2r_e$ is the diameter of the effective portion serving as the lens function of the rod lenses used. A preferred range of $2r_e/P$ is at least 0.9 to no more than 1, and a more preferable range is at least 0.92 to no more than 1.

Figure 6:
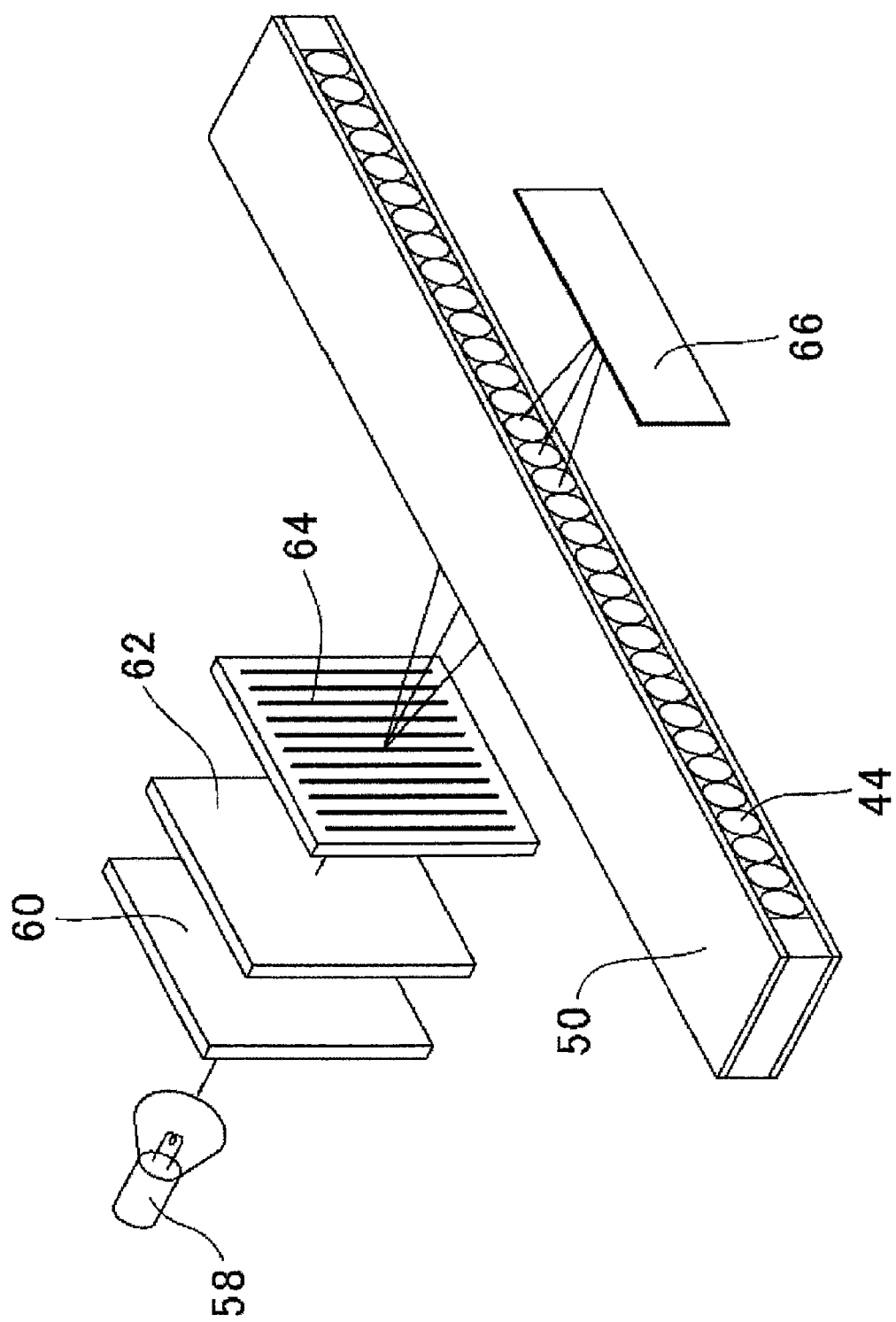
FIG. 6 is a view schematically showing the configuration of a device that evaluates the performance of the rod lens array of the preferred embodiment of the present invention.

Upon preparing the rod lens array 50 by aligning the rod lenses 44, it is common to align to provide a gap 56 between the rod lenses 44 with the object of an alignment precision improvement or crosstalk light elimination, and the array pitch P is larger than the diameter 2r of the rod lens 44 and the diameter $2r_e$ of the effective portion (FIG. 6).

As a result thereof, the effective portion serving as the lens function in the lens array comes to exist in "intervals". In the case of forming an image by way of a plurality of rod lenses, there is a tendency for the depth of focus to be narrower at a position between optical axes of adjacent lenses than at a position on the optical axis of each lens, at image formation surface of the rod lens array due to lens aberration. For this reason, when the effective portion serving as the lens function in the lens array exists at "intervals", the irregularity in depth of focus tends to be great.

Furthermore, by the proportion of the effective portion serving as the lens function becoming smaller, the light intensity tends to decrease, and the light intensity irregularity tends to become great.

In the present embodiment, by setting the ratio $2r_e/P$ between the diameter $2r_e$ of the effective portions of the rod lens 44 and the distance P between centers of adjacent rod lenses 44, 44 in the rod lens array to be $0.85 \leq 2r_e/P \leq 1$, it is possible to obtain a rod lens array having little depth of focus irregularity, high light intensity, and little light intensity irregularity.

In the rod lens array, adjacent rod lenses 44, 44 may be put in close contact with each other, or may be aligned with a fixed gap.

Figure 5:
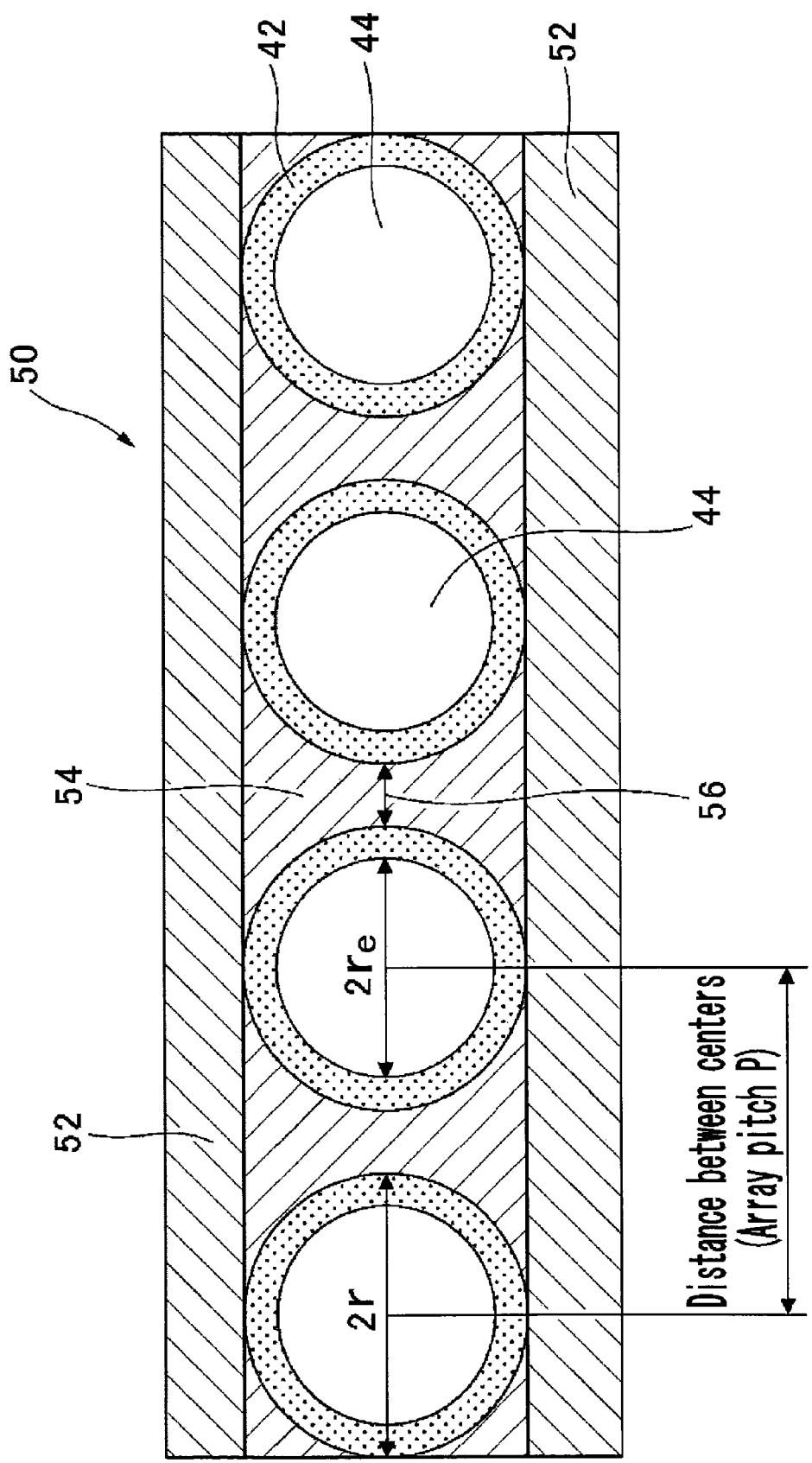
FIG. 5 is a cross-sectional view schematically showing the configuration of a rod lens array of a preferred embodiment of the present invention.

As the rod lens array 50, in addition to a single stack configuration in which a plurality of rod lenses 44 is aligned and arranged in a single stack between two of the substrates 52, 52 as shown in FIG. 5, it may be a configuration in which two or more stacks of the same type of rod lenses are aligned and arranged to overlap. In the configuration in which rod lenses are overlapped in two or more stacks, it is preferable to be aligned in trefoil form so that the gap between rod lenses is minimized.

In the rod lens array, a surface protective layer with the object of dust adhesion and damage prevention may be provided at the rod lens end faces. As this surface protective layer, a protective layer by a known UV-curable hard-coat agent, and a cover glass placed on the lens end face can be exemplified.

Generally, the depth of focus DOF of a lens is in an inversely-proportional relationship with the numerical aperture NA, and the relationship of the formula below also holds true for rod lenses. In other words, the depth of focus can be made deeper as decreasing the numerical aperture NA.

$$DOF = 0.156/NA \text{ (mm)}$$

Herein, the depth of focus DOF (mm) is measured by forming an image of a grid pattern having a spatial frequency of 6 Lp/mm using the rod lens employing light of 525 nm wavelength. More specifically, the depth of focus DOF is measured by arranging a wavelength filter 60, diffuser panel 62 and grid pattern 64 from the light source side between the light source 58 and the rod lens array 50 of the present embodiment, as shown in FIG. 6, and photographing an image of the grid pattern 64 by way of the rod lens array 50 with a CCD line sensor 66.

Figure 7:
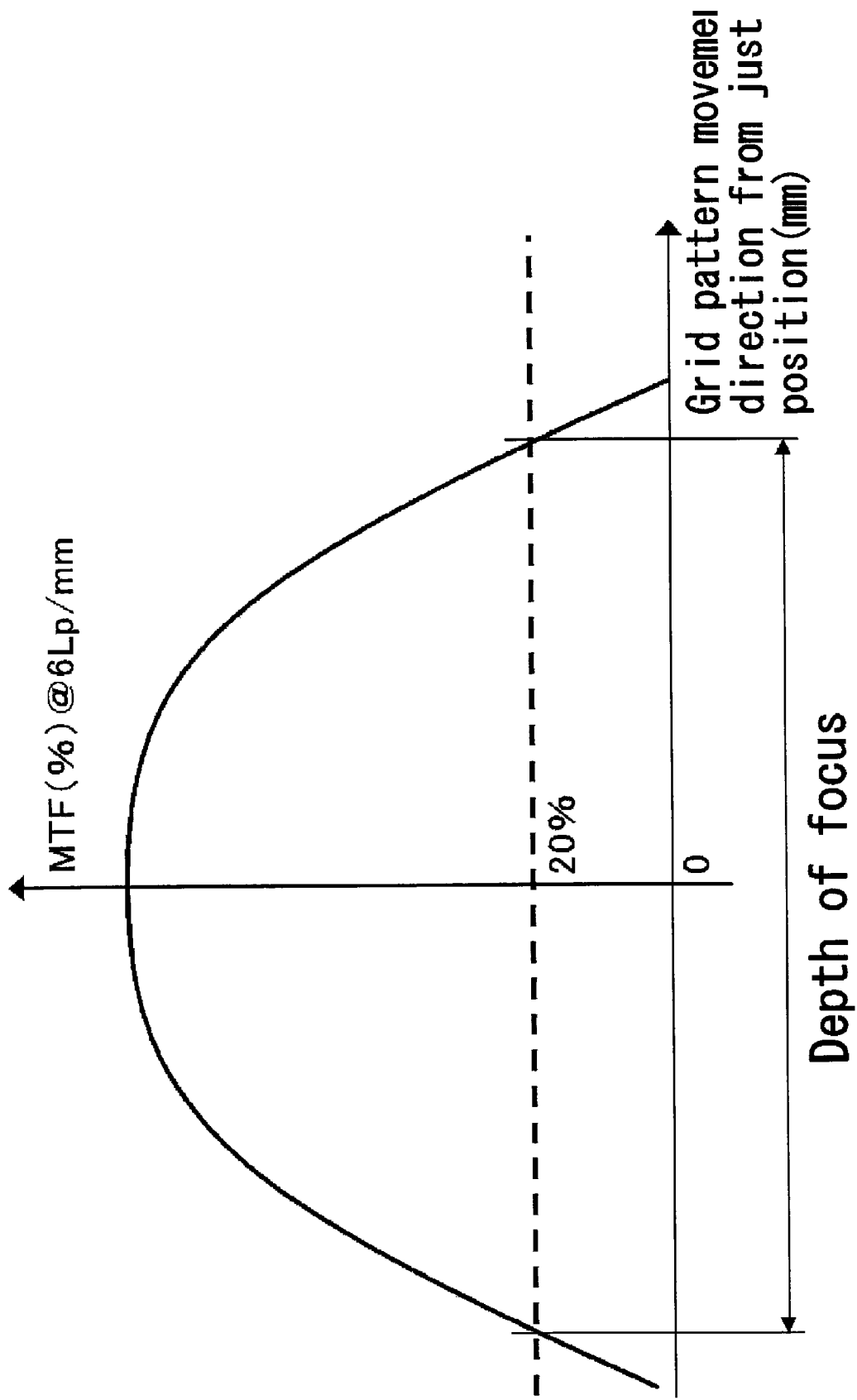
FIG. 7 is a view illustrating the way of determining the depth of focus.

First, the grid pattern 64, rod lens array 50 and CCD line sensor 66 are arranged so that an MTF (modulation transfer function) reaches a maximum (FIG. 6), and from this state, only the grid pattern 64 is made to move on the optical axis in the front-back direction (direction along optical axis), and the width (mm) of the movement range of the grid pattern for which the MTF is at least 40% is defined as the depth of focus DOF (mm) (refer to FIG. 7).

It should be noted that, in the present specification, "6 Lp/mm grid pattern" refers to the matter of a grid pattern providing 6 groups of a transparent line and shaded (black) line (line pair: Lp) inside of a width of 1 mm.

In addition, MTF refers to the matter of a value calculated by the formula below, from the maximum value (iMAX) and minimum value (iMIN) of the measured light intensity, when causing the grid pattern to form an image and reading on a photodetecting sensor by way of the rod lens.

$$MTF(\%) = ((iMAX - iMIN)/(iMAX + iMIN)) \times 100$$

In addition, since the light intensity of the lens is in a proportional relationship with the square of the numerical aperture NA, the light intensity decreases with reducing the numerical aperture. Therefore, although it is necessary to reduce the numerical aperture NA in order to deepen the depth of focus of the rod lens, the light intensity decreases if the numerical aperture NA is made too small.

The rod lens of the present embodiment can obtain sufficient depth of focus by setting the numerical aperture NA to no more than 0.175, and can ensure sufficient light intensity by setting to at least 0.06. The lower limit value for NA is preferably at least 0.1, and the upper limit value for NA is preferably no more than 0.15.

In the rod lens array 50 of the present embodiment, the average depth of focus DOFave in the array main scanning direction is 0.9 mm≤DOFave. A more preferable range for the average depth of focus DOFave is 0.9 mm≤DOFave≤2.6 mm, and more preferably is 1.0 mm≤DOFave≤2.3 mm, and even more preferably is 1.1 mm≤DOFave≤2.0 mm.

By setting DOFave to at least 0.9 mm, it is possible to clearly read an image even if the position of the read original is shifted. By setting DOFave to no more than 2.6 mm, it is possible to effectively transfer light of the light source, whereby electricity consumption can be curbed.

Herein, depth of focus DOF is the width (mm) of the movement range of the grid pattern at which the MTF becomes at least 40% when only the grid pattern is made to move after arranging a 6 Lp/mm grid pattern, rod lens and photoreceiving sensor in order, and DOFave is an average value of the depth of focus DOF in the main scanning direction of the lens array.

In addition, the rod lens array 50 of the present embodiment has irregularity in the depth of focus in the array main scanning direction (depth of focus irregularity) DOFcv that is DOFcv≤12%. DOFcv≤10% is preferable, and DOFcv≤5% is more preferable.

Herein, DOFcv is a value arrived at by dividing the standard deviation in depth of focus in the main scanning direction of the lens array by DOFave.

In the present embodiment, the rod lens satisfies formulas (1) to (3), and the rod lens array satisfies formula (4), whereby it is possible to obtain a rod lens array satisfying the aforementioned such average depth of focus and depth of focus irregularity.

The rod lens array 50 of the present embodiment can clearly and evenly read an image without irregularity, even if the position of the read original is shifted considerably, by way of assuming values of the above-mentioned such ranges.

As a result thereof, it is possible to clearly read an image even if the position of the read original is shifted considerably, and the read image is uniform without streaked unevenness due to being able to uniformly transfer the light of the light source, and by efficiently transferring the light of the light source, it becomes possible to provide an compact image sensor with low electricity consumption.

Image Sensor Head

Figure 8:
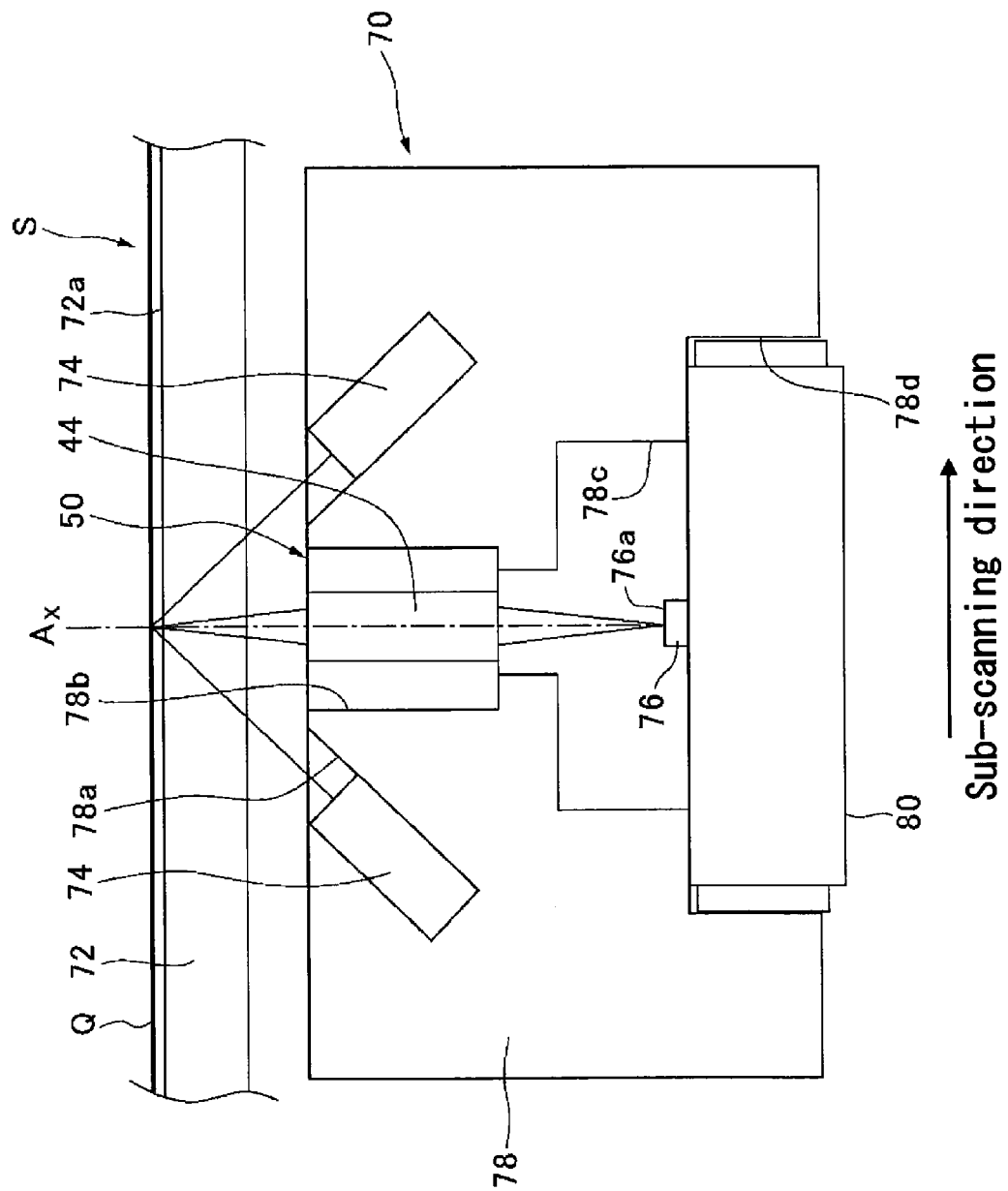
FIG. 8 is a cross-sectional view schematically showing a rod lens array of the preferred embodiment of the present invention incorporated into an image reading device.

Next, an image sensor head of the present embodiment will be explained along with FIG. 8.

An image sensor head 70 of the present embodiment includes the rod lens array 50 of the above-mentioned embodiment, and is incorporated into an image reading device S so as to read an image from an original Q placed on an original placement surface 72a of a platen 72.

The image sensor head 70 includes a linear light source 74 that irradiates light to the original Q placed on the original placement surface 72a of the platen 72, the rod lens array 50 that collects the reflected light from the original Q, a line image sensor 76 that receives light collected by the rod lens array 50, and a housing 78 that accommodates the line image sensor 76, etc.

The housing 78 is a box body of substantially cuboid shape, a first concave part 78a and second concave part 78b are formed in the top face of the box body 78, and a third concave part 78c is formed in the bottom face. The box body 78 is formed by injection molding of resin. By forming the box body 78 by way of injection molding, the housing 78 can be formed easily, and can be made low cost.

The linear light source 74 is obliquely fixed inside of the first concave part 78a. The linear light source 74 is fixed so that the optical axis of irradiated light passes through the intersection of an optical axis Ax of the rod lens array 50 and the original placement surface 72a, or the vicinity of the intersection.

The rod lens array 50 is fixed to the second concave part 78b. A substrate 80 equipped with the line image sensor 76 is mounted to the third concave part 78c. The substrate 80 is fixed so that a top surface thereof abuts a stepped part 78*d* provided to the third concave part 78*c*.

The rod lens array 50 is installed to the image sensor head 70 so that an alignment direction of the rod lenses matches the main scanning direction of the image reading device S. The rod lens array 50 receives the linear light incident from the original Q positioned above, and forms an equal magnification image on an image surface positioned below, i.e. a light receiving surface 76*a* of the line image sensor 76.

The image reading device S is a scanner of a stationary-type flathead scanner used in a photocopying machine, etc., and is made so as to be able to read the original Q by scanning the image sensor head 70 in a sub-scanning direction using a drive mechanism.

It should be noted that the rod lens array of the present embodiment and the image scanner can be employed in other types of image reading devices.

The thickness of glass 72*b* of such as a platen 72 is assumed to be no more than 3 mm.

Figure 9:
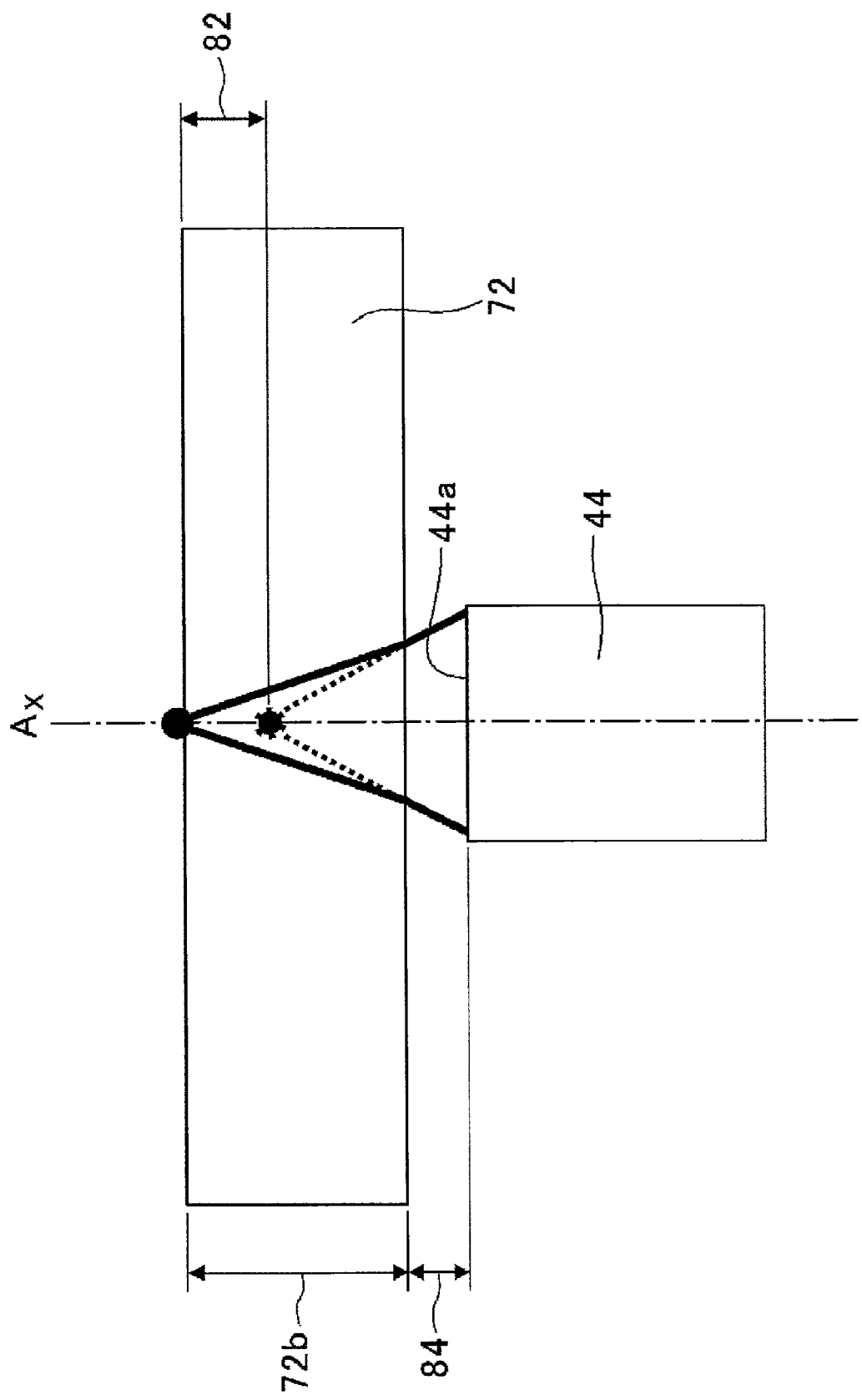
FIG. 9 is a view illustrating floating of focus in the rod lens array incorporated into the image reading device.

When considering float of focal point 82 (about −1 mm) arising from the platen 72 having a thickness of 3 mm, and a clearance 84 (preferably at least 1 mm) between the platen 72 and lens end face 44*a*, it is necessary for a working distance $L_0$ of the rod lens to be at least 3 mm (FIG. 9). Then, by setting the refractive index distribution constant g to within 0.6 mm$^{-1}$, the working distance $L_0$ of the rod lens can be set to 3 mm or more.

EXAMPLES

In the following example, the physical properties of the rod lens array were evaluated as follows.

<Measurement of Conjugation Length TC and Resolution (Average MTF)>

It was measured using a grid pattern having a spatial frequency 6 line pair/mm (Lp/mm).

More specifically, light (wavelength 525 nm) from the light source was made incident through the grid pattern onto the rod lens array that had both end faces perpendicular to the optical axis polished, the grid image was read by a CCD line sensor mounted at the image formation surface, the maximum value ($i_{max}$) and minimum value ($i_{min}$) of the measured light intensity thereof were measured, and the MTF (modulation transfer function) was obtained according to the formula below.

$$MTF\ (\%) = \{(i_{max} - i_{min})/(i_{max} + i_{min})\} \times 100$$

On this occasion, the distance between the grid pattern and the incident end of the rod lens array, and the distance between the irradiating end of the rod lens array and the CCD line sensor were made equal. Then, the MTF was measured by moving the grid pattern and CCD line sensor symmetrically relative to the rod lens array, and when the MTF became the best, the distance between the grid pattern and the CCD line sensor was defined as the conjugation length TC.

The distance between the grid pattern and the CCD line sensor was fixed at the conjugation length, the MTF was measured at 50 points by scanning the rod lens array overall width, the average value of these (average MTF) was obtained, and established as an index of resolution. As the value of the average MTF increases, the resolution becomes superior.

Herein, defining a combination of a white line and black line as 1 line, the spatial frequency is a value indicating how many groups of combinations of these lines are provided within a width of 1 mm.

<Measurement of Depth of Focus DOF (mm), Average Depth of Focus DOFave (mm) and Depth of Focus Irregularity DOFcv (%)>

The depth of focus was measured using a grid pattern having a spatial frequency 6 line pair/mm (Lp/mm).

More specifically, the rod lens array and CCD line sensor are fixed after sequentially arranging the grid pattern, rod lens array and photodetecting sensor so that the MTF reaches a maximum (conjugation length TC), the MTF was evaluated by moving only the grid pattern back and forth on the optical axis, and the depth of focus DOF (mm) was evaluated as the width (mm) of the movement range of the grid pattern for which MTF was at least 40%. High resolution tends to be maintained more as the value of the depth of focus increases, even in the case of the original having shifted from the focal position.

In regards to the average depth of focus DOFave (mm), the above-mentioned depth of focus DOF (mm) was measured at 100 points at 50 μm intervals in the main scanning direction of the rod lens array, and the average depth of focus DOFave (mm) was obtained as the average value thereof.

In addition, in regards to the depth of focus irregularity DOFcv (%), upon measuring the depth of focus DOF at 100 points at 50 μm intervals in the main scanning direction of the rod lens array, the depth of focus irregularity DOFcv (%) was obtained as a value arrived at by dividing the standard deviation of the depth of focus DOF (mm) by the average depth of focus DOFave (mm).

$$DOFcv(\%) = \{DOF\ \text{standard deviation}(mm)/DOFave\ (mm)\} \times 100$$

As the value of the depth of focus irregularity DOFcv (%) decreases, the resolution irregularity decreases when the original has shifted from the focal position, and a uniform image is obtained.

<Measurement of Light Intensity and Light Intensity Irregularity>

The light intensity is measured using an oval diffusion plate in place of the grid pattern used in the measurement of resolution.

More specifically, light from the light source (wavelength 525 nm) is made incident on the rod lens array through the diffusion plate, the light intensity output is measured by a CCD line sensor mounted at the image formation surface, and the maximum value of the measured value ($i_{max}$) is recorded. On this occasion, the distance between the diffusion plate and the incident end of the rod lens array and the distance between the irradiating end of the rod lens array and the CCD line sensor are equal, and the distance between the diffusion plate and CCD line sensor is the conjugation length.

The distance between the diffusion plate and CCD line sensor was fixed at the conjugation length, the light intensity output was measured at 50 points by scanning the rod lens array overall width, and the average value of these (average light intensity) was obtained. Herein, when defining the average light intensity of a SELFOC lens SLA6A (manufactured by Nippon Sheet Glass Co., Ltd.), which is a rod lens commonly used in photocopying machines, as 100%, the light intensity percentage (%) of the target lens was defined as an index of light intensity. As the value of light intensity increases, it is possible to handle printing at higher speed.

In addition, regarding the light intensity irregularity, the distance between the diffusion plate and CCD line sensor was fixed at the conjugation length, the light intensity output was measured at 50 points by scanning the rod lens array overall width, and a value arrived at by dividing the difference between the maximum value ($i_{max}$) and minimum value ($i_{min}$) of the measured light intensity by the light intensity average value (average light intensity) was calculated as the light intensity irregularity dI (%) represented by the formula below.

$$dI\ (\%)=\{(i_{max}-i_{min})/\text{average light intensity}\}\times 100$$

Example 1

A first layer formation stock solution (uncured form material) was made by heating and kneading 43.5 parts by mass of polymethyl methacrylate (PMMA), 15.5 parts by mass of methyl methacrylate (MMA), 7.5 parts by mass of phenyl methacrylate (PhMA), 3.5 parts by mass of t-butyl methacrylate (TBMA), 30 parts by mass of tricyclo[5.2.1.0$^{2,6}$]decanyl methacrylate (TCDMA), 0.25 parts by mass of 1-hydroxycyclohexyl phenyl ketone (HCPK), and 0.1 parts by mass of hydroquinone (HQ) at 70° C.

A second layer formation stock solution (uncured form material) was made by heating and kneading 44 parts by mass of PMMA, 17 parts by mass of MMA, 8 parts by mass of PhMA, 5.5 parts by mass of TBMA, 25.5 parts by mass of TCDMA, 0.25 parts by mass of HCPK, and 0.1 parts by mass of HQ at 70° C.

A third layer formation stock solution (uncured form material) was made by heating and kneading 46 parts by mass of PMMA, 16.5 parts by mass of MMA, 11 parts by mass of PhMA, 8.5 parts by mass of TBMA, 12.5 parts by mass of TCDMA, 5.5 parts by mass of 2,2,3,3-tetrafluoropropyl methacrylate (4FM), 0.25 parts by mass of HCPK and 0.1 parts by mass of HQ at 70° C.

A fourth layer formation stock solution (uncured form material) was made by heating and kneading 44.5 parts by mass of PMMA, 11.5 parts by mass of MMA, 15 parts by mass of PhMA, 9 parts by mass of TCDMA, 20 parts by mass of 4FM, 0.25 parts by mass of HCPK and 0.1 parts by mass of HQ at 70° C.

A fifth layer formation stock solution (uncured form material) was made by heating and kneading 44.5 parts by mass of PMMA, 11.5 parts by mass of MMA, 15 parts by mass of PhMA, 9 parts by mass of TCDMA, 20 parts by mass of 4FM, 0.25 parts by mass of HCPK and 0.1 parts by mass of HQ at 70° C. It should be noted that HCPK is a photo-curing catalyst, and HQ is a polymerization inhibitor.

The compositions of the stock solutions of each layer are shown in Table 1 (Example, stock solution, composition, radius ratio).

TABLE 1

EXAMPLES STOCK SOLUTION COMPOSITION, RADIUS RATIO

| | | STOCK SOLUTION COMPOSITION (PARTS BY MASS) | | | | | | | |
|---|---|---|---|---|---|---|---|---|---|
| | | PMMA | MMA | PhMA | BzMA | TBMA | TCDMA | 8FM | 4FM |
| | FIRST LAYER | 43.5 | 15.5 | 7.5 | | 3.5 | 30 | | |
| | SECOND LAYER | 44 | 17 | 8 | | 5.5 | 25.5 | | |
| Example 1 | THIRD LAYER | 46 | 16.5 | 11 | | 8.5 | 12.5 | | |
| Example 2 | FOURTH LAYER | 44.5 | 11.5 | 15 | | | 9 | | 20 |
| Example 3 | FIFTH LAYER | 44.5 | 11.5 | 15 | | | 9 | | 20 |
| | FIRST LAYER | 43.5 | 15.5 | 7.5 | | 3.5 | 30 | | |
| | SECOND LAYER | 44 | 17 | 8 | | 5.5 | 25.5 | | |
| | THIRD LAYER | 46 | 16.5 | 11 | | 8.5 | 12.5 | | 5.5 |
| | FOURTH LAYER | 44.5 | 11.5 | 15 | | | 9 | | 20 |
| Example 4 | FIFTH LAYER | 44.5 | 11.5 | 15 | | | 9 | | 20 |

| | | DYE (PARTS BY MASS) | | | | | |
|---|---|---|---|---|---|---|---|
| | | HD-180 | HM-1450 | A-CR | 4G | CY-10 | RADIUS RATIO (%) |
| | FIRST LAYER | | | | | | 35 |
| | SECOND LAYER | | | | | | 33.5 |
| Example 1 | THIRD LAYER | | | | | | 24.5 |
| Example 2 | FOURTH LAYER | | | | | | 4 |
| Example 3 | FIFTH LAYER | 0.15 | 0.15 | 0.58 | 0.03 | 0.02 | 3 |
| | FIRST LAYER | | | | | | 11 |
| | SECOND LAYER | | | | | | 34 |
| | THIRD LAYER | | | | | | 38 |
| | FOURTH LAYER | | | | | | 10 |
| Example 4 | FIFTH LAYER | 0.15 | 0.15 | 0.58 | 0.03 | 0.02 | 7 |

It should be noted that, with the purpose of suppressing crosstalk light and flare light, 0.58% by mass of the dye Blue ACR (manufactured by Nippon Kayaku Co., Ltd.), 0.15 parts by mass of the dye MS Yellow HD-180 (manufactured by Mitsui Toatsu Dye Ltd.) and MS Magenta HM-1450 (manufactured by Mitsui Toatsu Dye Ltd.), respectively, 0.03 parts by mass of the dye Diaresin Blue 4G (manufactured by Mitsubishi Chemical Corp.), and 0.02 parts by mass of Kayasorb CY-10 (manufactured by Nippon Kayaku Co., Ltd.) were added relative to the total stock solution into the fifth layer formation stock solution prior to heating and kneading.

These five types of stock solutions were simultaneously extruded from a concentric 5-layer composite spinning nozzle, arranging so that the refractive index after curing would sequentially decrease from the center to the outer periphery. The temperature of the composite spinning nozzle was set to 50° C.

The discharge ratio of respective layers were set to first layer/second layer/third layer/fourth layer/fifth layer=35.0/35.5/24.5/4/3, by converting to the ratio of thickness (radius of first later) of each layer in the radial direction of the rod lens.

Herein, the first layer is the inner most layer, and the fifth layer is the outer most layer.

Next, the rod lens base fiber was manufactured using the manufacturing equipment 10 for the rod lens base fiber made of plastic shown in FIG. 1, from the obtained stock solutions.

More specifically, along with introducing nitrogen gas from the inert gas introduction pipe into the storage body, inert gas inside of the storage body was made to discharge from the inert gas discharge pipe.

In addition, the filament A extruded from the concentric composite spinning nozzle was received (200 cm/min) by the receiving roller (nip roller), and passed the interdiffusion processing part having a length of 30 cm, to cause interdiffusion to occur between each layer.

Then, the filament A was made to pass over the center of the first cure processing part (photoirradiation part) in which eighteen 40 W chemical lamps of 120 cm length were disposed at equal intervals around the central axis to cause to cure while allowing interdiffusion between each layer. Successively, the filament A was made to further cure by passing over the center of the second cure processing part (photoirradiation part) in which three 2 KW high pressure mercury lamps were disposed at equal intervals around the central axis. It should be noted that the nitrogen flow rate in the interdiffusion processing part was set to 72 L/min.

The radius of the rod lens base fiber thereby obtained was 0.30 mm.

Then, the obtained rod lens base fiber was cut to lengths of 166 mm to obtain the rod lenses.

The radius r of the rod lens obtained in this way was 0.30 mm, the center refractive index $n_0$ was 1.503 at the wavelength of 525 nm, and approximating the refractive index distribution in the range from 0.2r to 0.9r from the center to the outer periphery by a formula relating to the aforementioned refractive index distribution, the refractive index distribution constant g was 0.33 $mm^{-1}$ at the wavelength of 525 nm. In addition, a layer in which dye is mixed was formed from the outer periphery towards the center, the effective radius $r_e$ being 0.286 mm, and the numerical aperture NA of the lens being 0.142.

Using 520 of the obtained rod lenses, a 1-line rod lens array was prepared in which the lens length was 12.0 mm and array pitch P was 0.615 mm (gap between adjacent lenses of 0.015 mm). The ratio $2r_e/P$ of the diameter $2r_e$ of the effective portion and array pitch P was 0.93.

The rod lens array obtained in this way had a conjugation length Tc at wavelengths of 470 nm, 525 nm and 630 nm of substantially the same at 21.3 mm, and a working distance $L_0$ of 4.6 mm.

Figure 10:
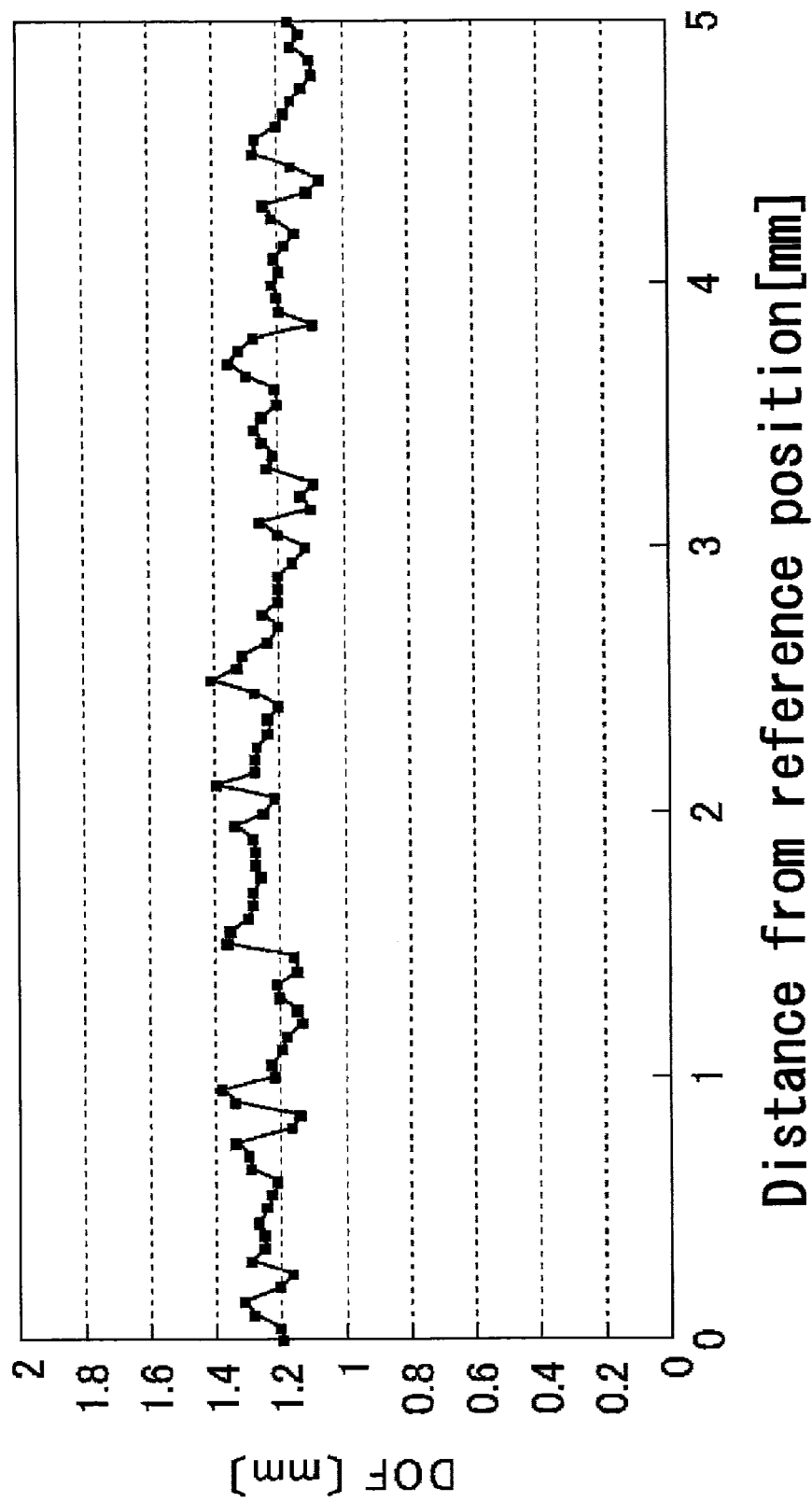
FIG. 10 is a graph showing the focal depth measurement results of a rod lens array of Example 1 of the present invention.

In addition, the average depth of focus DOFave of the obtained rod lens array was 1.22 mm, the depth of focus irregularity DOFcv was 5.9%, the light intensity was 268%, and the light intensity irregularity was 15%. The measurement results are shown in FIG. 10 and Table 2 (Examples, Comparative Examples Results).

TABLE 2

| | RADIUS r (mm) | LENS LENGTH Z0 (mm) | CONJUGATION LENGTH TC (mm) | REFRACTIVE INDEX DISTRIBUTION CONSTANT ($mm^{-1}$) | CENTER REFRACTIVE INDEX | EFFECTIVE RADIUS re (mm) | NUMERICAL APERTURE NA | 2Re/P |
|---|---|---|---|---|---|---|---|---|
| Example 1 | 0.3 | 12.0 | 21.3 | 0.33 | 1.503 | 0.286 | 0.142 | 0.93 |
| Example 2 | 0.232 | 8.8 | 18.1 | 0.43 | 1.503 | 0.22 | 0.142 | 0.94 |
| Example 3 | 0.175 | 6.7 | 13.6 | 0.57 | 1.503 | 0.166 | 0.142 | 0.95 |
| Example 4 | 0.12 | 8.8 | 18.1 | 0.43 | 1.502 | 0.11 | 0.071 | 0.88 |
| Comparative Example 1 | 0.3 | 8.0 | 15.6 | 0.48 | 1.497 | 0.283 | 0.203 | 0.92 |
| Comparative Example 2 | 0.178 | 4.4 | 10.0 | 0.84 | 1.497 | 0.166 | 0.209 | 0.90 |
| Comparative Example 3 | 0.232 | 9.5 | 19.2 | 0.40 | 1.503 | 0.18 | 0.108 | 0.78 |

| | WORKING DISTANCE $L_0$ (mm) | | DOFave (mm) @40% | | DOFcv (%) @40% | | LIGHT INTENSITY I (%) | | LIGHT INTENSITY IRREGULARITY dI (%) | | READ IMAGE IRREGULARITY DURING ORIGINAL FLOAT |
|---|---|---|---|---|---|---|---|---|---|---|---|
| Example 1 | 4.6 | ◎ | 1.22 | ◎ | 5.9 | ○ | 268 | ◎ | 15 | ◎ | ○ |
| Example 2 | 4.7 | ◎ | 1.19 | ◎ | 7.9 | ○ | 216 | ◎ | 14 | ◎ | ○ |
| Example 3 | 3.5 | ◎ | 1.27 | ◎ | 4.8 | ◎ | 220 | ◎ | 12 | ◎ | ◎ |
| Example 4 | 4.7 | ◎ | 2.20 | ◎ | 9.0 | ○ | 50 | ○ | 19 | ○ | ○ |
| Comparative Example 1 | 3.8 | ◎ | 0.77 | X | 5.4 | ○ | 469 | ◎ | 15 | ◎ | — |
| Comparative Example 2 | 2.8 | X | 0.87 | X | 3.8 | ◎ | 385 | ◎ | 12 | ◎ | — |
| Comparative Example 3 | 4.9 | ◎ | 1.51 | ◎ | 12.8 | X | 106 | ◎ | 35 | X | X |

Since the image sensor head was prepared using this rod lens array, a compact image sensor head could be obtained. In addition, images of high resolution were obtained even when there was some float in the original due to performing reading using this image sensor head, and the irregularity in the images caused by irregularity in the depth of focus was also small. In the case of there being no float in the original, a clear image was obtained due to the light intensity being great and the light intensity irregularity being small. In addition, streaked unevenness was not observed in the read image.

Example 2

A rod lens was prepared in the same way as Example 1 except for, after the filament after cure processing was drawn 2.34 times at 145° C., conducting relaxation processing so that the relaxation rate at 127° C. became 0.71.

The radius r of the rod lens obtained in this way was 0.232 mm, the center refractive index $n_0$ was 1.503 at the wavelength of 525 nm, and approximating the refractive index distribution in the range from 0.2r to 0.9r from the center to the outer periphery by a formula relating to the aforementioned refractive index distribution, the refractive index distribution constant g was 0.43 mm$^{-1}$ at the wavelength of 525 nm. In addition, a layer in which dye is mixed was formed from the outer periphery towards the center, the effective radius $r_e$ being 0.220 mm, and the numerical aperture NA of the lens being 0.142.

Using 684 of the obtained rod lenses, a 1-line rod lens array was prepared in which the lens length was 8.8 mm and array pitch P was 0.468 mm (gap between adjacent lenses of 0.004 mm). The ratio $2r_e/P$ of the diameter $2r_e$ of the effective portion and array pitch P was 0.94.

The rod lens array obtained in this way had a conjugation length Tc at wavelengths of 470 nm, 525 nm and 630 nm of substantially the same at 18.1 mm, and a working distance $L_0$ of 4.7 mm.

Figure 11:
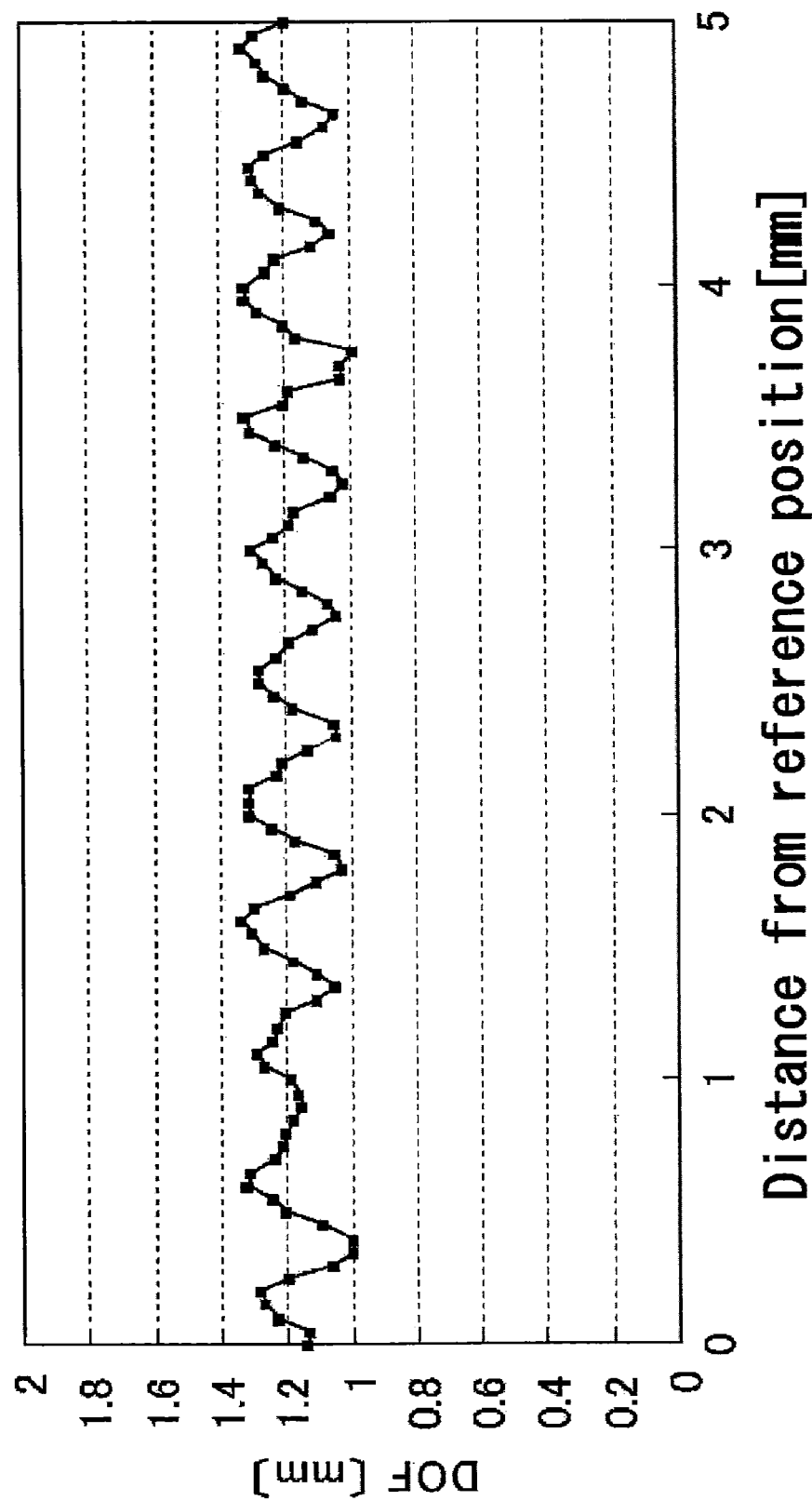
FIG. 11 is a graph showing the focal depth measurement results of a rod lens array of Example 2 of the present invention.

In addition, the average depth of focus DOFave of the obtained rod lens array was 1.19 mm, the depth of focus irregularity DOFcv was 7.9%, the light intensity was 216%, and the light intensity irregularity was 14%. The measurement results are shown in FIG. 11 and Table 2.

Since the image sensor head was prepared using this rod lens array, a compact image sensor head could be obtained. In addition, images of high resolution were obtained even when there was some float in the original due to performing reading using this image sensor head, and the irregularity in the images caused by irregularity in the depth of focus was also small. In the case of there being no float in the original, a clear image was obtained due to the light intensity being great and the light intensity irregularity being small. In addition, streaked unevenness was not observed in the read image.

Example 3

A rod lens was prepared in the same way as Example 1 except for, after the filament after cure processing was drawn 4.11 times at 145° C., conducting relaxation processing so that the relaxation rate at 127° C. became 0.71.

The radius r of the rod lens obtained in this way was 0.175 mm, the center refractive index $n_0$ was 1.503 at the wavelength of 525 nm, and approximating the refractive index distribution in the range from 0.2r to 0.9r from the center to the outer periphery by a formula relating to the aforementioned refractive index distribution, the refractive index distribution constant g was 0.57 mm$^{-1}$ at the wavelength of 525 nm. In addition, a layer in which dye is mixed was formed from the outer periphery towards the center, the effective radius $r_e$ being 0.166 mm, and the numerical aperture NA of the lens being 0.142.

Using 914 of the obtained rod lenses, a 1-line rod lens array was prepared in which the lens length was 6.7 mm and array pitch P was 0.350 mm (gap between adjacent lenses of 0 mm). The ratio $2r_e/P$ of the diameter $2r_e$ of the effective portion and array pitch P was 0.95.

The rod lens array obtained in this way had a conjugation length Tc at wavelengths of 470 nm, 525 nm and 630 nm of substantially the same at 13.6 mm, and a working distance $L_0$ of 3.5 mm.

Figure 12:
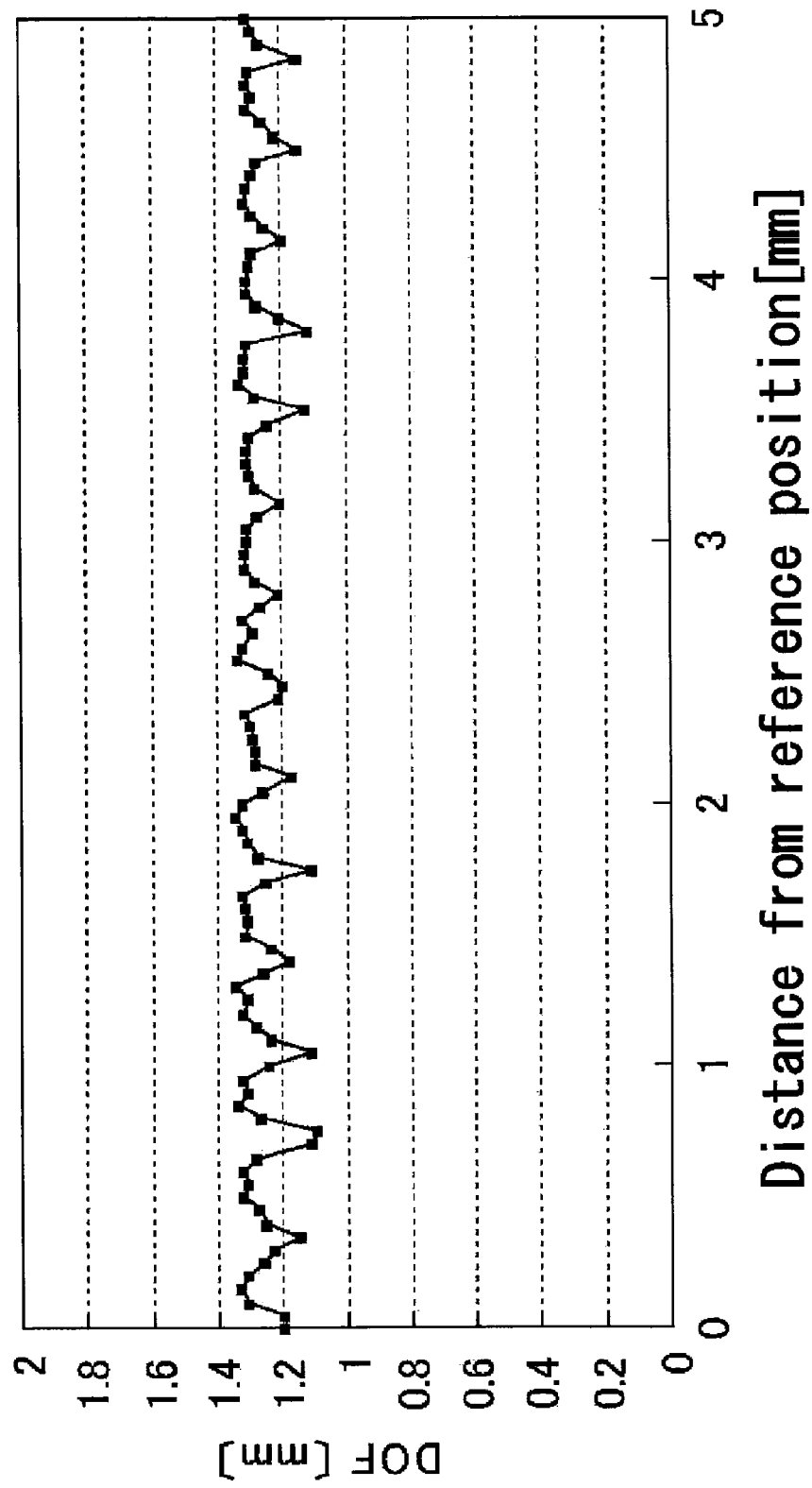
FIG. 12 is a graph showing the focal depth measurement results of a rod lens array of Example 3 of the present invention.

In addition, the average depth of focus DOFave of the obtained rod lens array was 1.27 mm, the depth of focus irregularity DOFcv was 4.8%, the light intensity was 220%, and the light intensity irregularity was 12%. The measurement results are shown in FIG. 12 and Table 2.

Since the image sensor head was prepared using this rod lens array, a very compact image sensor head could be obtained. In addition, images of high resolution were obtained even when there was some float in the original due to performing reading using this image sensor head, and the irregularity in the images caused by irregularity in the depth of focus was also very small. In the case of there being no float in the original, a clear image was obtained due to the light intensity being great and the light intensity irregularity being small. In addition, streaked unevenness was not observed in the read image.

Example 4

A rod lens was prepared in the same way as Example 1 except for setting the discharge ratio of respective layers to first layer/second layer/third layer/fourth layer/fifth layer=11.0/34.0/38.0/10.0/7, as well as setting the receiving speed at the receiving roller (nip roller) 17 to 300 cm/min, and after the filament after cure processing was drawn 5.83 times at 145° C., conducting relaxation processing so that the relaxation rate at 127° C. became 0.71.

The radius r of the rod lens obtained in this way was 0.120 mm, the center refractive index $n_0$ was 1.502 at the wavelength of 525 nm, and approximating the refractive index distribution in the range from 0.2r to 0.9r from the center to the outer periphery by a formula relating to the aforementioned refractive index distribution, the refractive index distribution constant g was 0.43 mm$^{-1}$ at the wavelength of 525 nm. In addition, a layer in which dye is mixed was formed from the outer periphery towards the center, the effective radius $r_e$ being 0.110 mm, and the numerical aperture NA of the lens being 0.071.

Using 1280 of the obtained rod lenses, a 1-line rod lens array was prepared in which the lens length was 8.8 mm and array pitch P was 0.250 mm (gap between adjacent lenses of 0.01 mm). The ratio $2r_e/P$ of the diameter $2r_e$ of the effective portion and array pitch P was 0.88.

The rod lens array obtained in this way had a conjugation length Tc at wavelengths of 470 nm, 525 nm and 630 nm of substantially the same at 18.1 mm, and a working distance $L_0$ of 4.7 mm.

Figure 13:
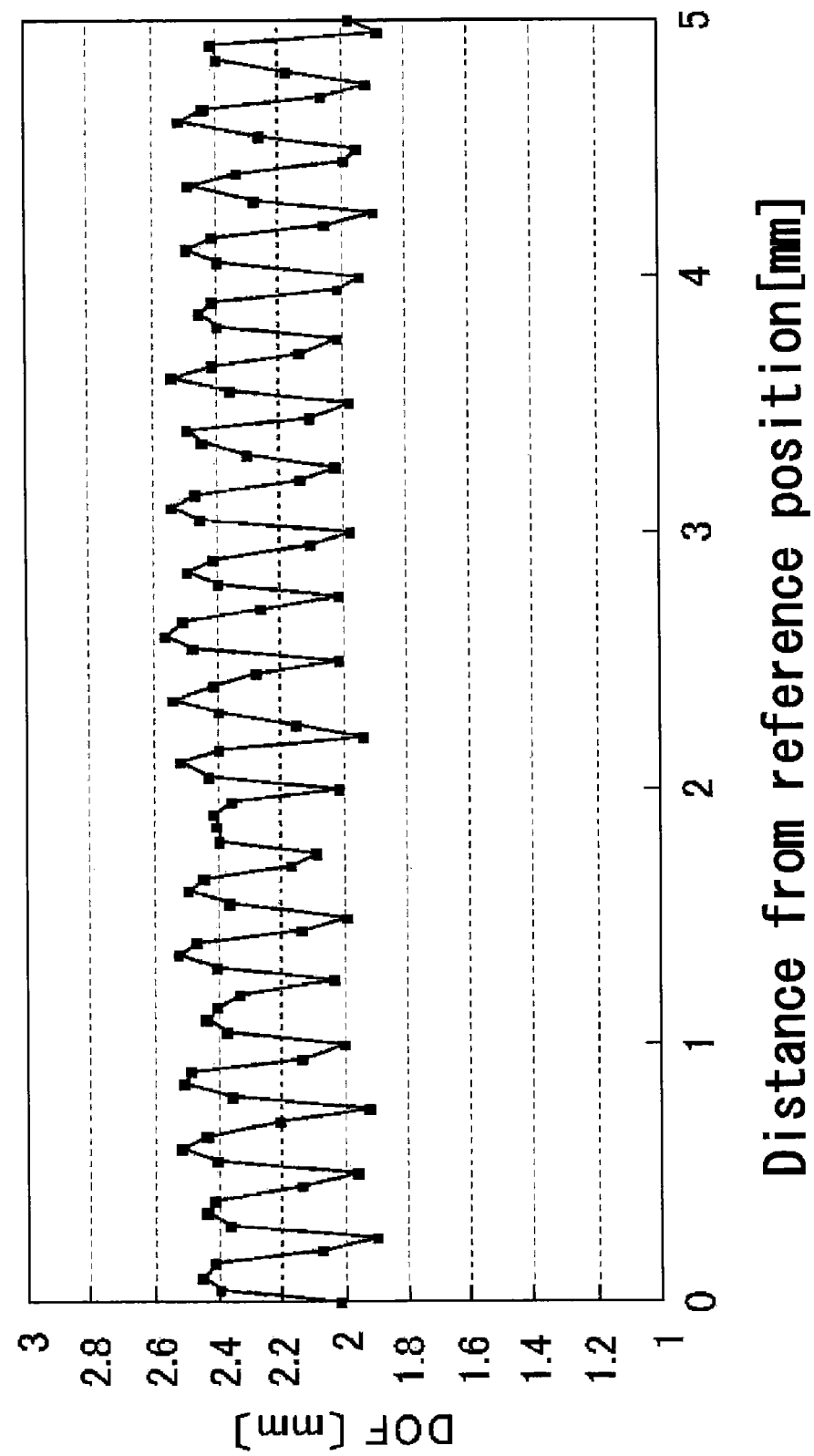
FIG. 13 is a graph showing the focal depth measurement results of a rod lens array of Example 4 of the present invention.

In addition, the average depth of focus DOFave of the obtained rod lens array was 2.20 mm, the depth of focus irregularity DOFcv was 9.0%, the light intensity was 50%, and the light intensity irregularity was 19%. The measurement results are shown in FIG. 13 and Table 2.

Since the image sensor head was prepared using this rod lens array, a compact image sensor head could be obtained. In addition, images of high resolution were obtained even when there was considerable float in the original due to performing reading using this image sensor head, and the irregularity in the images caused by irregularity in the depth of focus was also comparatively small. In the case of there being no float in the original, a clear image was obtained due to the light intensity being comparatively great and the light intensity irregularity being comparatively small. In addition, streaked unevenness was not observed in the read image.

Comparative Example 1

A first layer formation stock solution (uncured form material) was made by heating and kneading 46 parts by mass of PMMA, 24 parts by mass of MMA, 30 parts by mass of TCDMA, 0.25 parts by mass of HCPK, and 0.1 parts by mass of HQ at 70° C.

A second layer formation stock solution (uncured form material) was made by heating and kneading 46 parts by mass of PMMA, 29 parts by mass of MMA, 5 parts by mass of benzyl methacrylate (BzMA), 15 parts by mass of TCDMA, 5 parts by mass of 2,2,3,3,4,4,5,5-octafluoropentylmethacrylate (8FM), 0.25 parts by mass of HCPK and 0.1 parts by mass of HQ at 70° C.

A third layer formation stock solution (uncured form material) was made by heating and kneading 49 parts by mass of PMMA, 37 parts by mass of MMA, 6 parts by mass of BzMA, 8 parts by mass of 8FM, 0.25 parts by mass of HCPK and 0.1 parts by mass of HQ at 70° C.

A fourth layer formation stock solution (uncured form material) was made by heating and kneading 47 parts by mass of PMMA, 23 parts by mass of MMA, 10 parts by mass of BzMA, 20 parts by mass of 8FM, 0.25 parts by mass of HCPK and 0.1 parts by mass of HQ at 70° C.

A fifth layer formation stock solution (uncured form material) was made by heating and kneading 39 parts by mass of PMMA, 3 parts by mass of MMA, 17 parts by mass of BzMA, 41 parts by mass of 8FM, 0.25 parts by mass of HCPK and 0.1 parts by mass of HQ at 70° C.

The compositions of the stock solutions of each layer are shown in Table 3 (Comparative Example, stock solution composition, radius ratio).

It should be noted that, with the purpose of suppressing crosstalk light and flare light, 0.01 parts by mass of the dye Blue ACR (manufactured by Nippon Kayaku Co., Ltd.), the dye MS Yellow HD-180 (manufactured by Mitsui Toatsu Dye Ltd.), MS Magenta HM-1450 (manufactured by Mitsui Toatsu Dye Ltd.), the dye Diaresin Blue 4G (manufactured by Mitsubishi Chemical Corp.), and Kayasorb CY-10 (manufactured by Nippon Kayaku Co., Ltd.) were respectively added relative to the total stock solution into the fourth layer formation stock solution prior to heating and kneading. In addition, 0.57% by mass of the dye Blue ACR (manufactured by Nippon Kayaku Co., Ltd.), 0.14 parts by mass of the dye MS Yellow HD-180 (manufactured by Mitsui Toatsu Dye Ltd.) and MS Magenta HM-1450 (manufactured by Mitsui Toatsu Dye Ltd.), respectively, 0.03 parts by mass of the dye Diaresin Blue 4G (manufactured by Mitsubishi Chemical Corp.), and 0.01 parts by mass of Kayasorb CY-10 (manufactured by Nippon Kayaku Co., Ltd.) were added relative to the total stock solution into the fifth layer formation stock solution prior to heating and kneading.

These five types of stock solutions were simultaneously extruded from a concentric 5-layer composite spinning nozzle, arranging so that the refractive index after curing would sequentially decrease from the center to the outer periphery. The temperature of the composite spinning nozzle was set to 50° C.

The discharge ratios of respective layers were set to first layer/second layer/third layer/fourth layer/fifth layer=21.0/25.0/33.0/19/2, by converting to the ratio of thickness (radius of first later) of each layer in the radial direction of the rod lens.

TABLE 3

COMPARATIVE EXAMPLES, STOCK SOLUTION COMPOSITION, RADIUS RATIO

| | | STOCK SOLUTION COMPOSITION (PARTS BY MASS) | | | | | | | |
|---|---|---|---|---|---|---|---|---|---|
| | | PMMA | MMA | PhMA | BzMA | TBMA | TCDMA | 8FM | 4FM |
| | FIRST LAYER | 46 | 24 | | | | 30 | | |
| | SECOND LAYER | 46 | 29 | | 5 | | 15 | 5 | |
| | THIRD LAYER | 49 | 37 | | 6 | | | 8 | |
| Comparative Example 1 | FOURTH LAYER | 47 | 23 | | 10 | | | 20 | |
| Comparative Example 2 | FIFTH LAYER | 39 | 3 | | 17 | | | 41 | |
| | FIRST LAYER | 52 | 13 | | 35 | | | | |
| | SECOND LAYER | 51 | 16 | | 33 | | | | |
| | THIRD LAYER | 50 | 20 | | 30 | | | | |
| | FOURTH LAYER | 50 | 35 | | 15 | | | | |
| Comparative Example 3 | FIFTH LAYER | 42 | 18 | | | | | 40 | |

| | | DYE (PARTS BY MASS) | | | | | |
|---|---|---|---|---|---|---|---|
| | | HD-180 | HM-1450 | A-CR | 4G | CY-10 | RADIUS RATIO (%) |
| | FIRST LAYER | | | | | | 21 |
| | SECOND LAYER | | | | | | 25 |
| | THIRD LAYER | | | | | | 33 |
| Comparative Example 1 | FOURTH LAYER | 0.01 | 0.01 | 0.01 | 0.01 | 0.01 | 19 |
| Comparative Example 2 | FIFTH LAYER | 0.14 | 0.14 | 0.57 | 0.01 | 0.01 | 2 |
| | FIRST LAYER | | | | | | 48 |
| | SECOND LAYER | | | | | | 14 |
| | THIRD LAYER | | | | | | 16 |
| | FOURTH LAYER | 0.01 | 0.01 | 0.01 | 0.01 | | 21 |
| Comparative Example 3 | FIFTH LAYER | | | | | | 1 |

Herein, the first layer is the inner most layer, and the fifth layer is the outer most layer.

Next, the rod lens base fiber was manufactured using the manufacturing equipment for the rod lens base fiber made of plastic shown in FIG. 1, from the obtained stock solutions.

More specifically, along with introducing nitrogen gas from the inert gas introduction pipe into the storage body, inert gas inside of the storage body was made to discharge from the inert gas discharge pipe.

In addition, the filament A extruded from the concentric composite spinning nozzle was received (200 cm/min) by the receiving roller (nip roller), and passed the interdiffusion processing part having a length of 30 cm, to cause interdiffusion to occur between each layer.

Then, the filament A was made to pass over the center of the first cure processing part (photoirradiation part) in which eighteen 40 W chemical lamps of 120 cm length are disposed at equal intervals around the central axis to cause to cure while allowing interdiffusion between each layer. Successively, the filament A was made to further cure by passing over the center of the second cure processing part (photoirradiation part) in which three 2 KW high pressure mercury lamps are disposed at equal intervals around the central axis. It should be noted that the nitrogen flow rate in the interdiffusion processing unit was set to 72 L/min.

The radius of the rod lens base fiber thereby obtained was 0.30 mm.

Then, the obtained rod lens base fiber was cut to lengths of 166 mm to obtain the rod lenses.

The radius r of the rod lens obtained in this way was 0.30 mm, the center refractive index $n_0$ was 1.497 at the wavelength of 525 nm, and approximating the refractive index distribution in the range from 0.2r to 0.9r from the center to the outer periphery by a formula relating to the aforementioned refractive index distribution, the refractive index distribution constant g was 0.48 $mm^{-1}$ at the wavelength of 525 nm. In addition, a layer in which dye is mixed was formed from the outer periphery towards the center, the effective radius $r_e$ being 0.283 mm, and the numerical aperture NA of the lens being 0.203.

Using 520 of the obtained rod lenses, a 1-line rod lens array was prepared in which the lens length was 8 mm and array pitch P was 0.615 mm (gap between adjacent lenses of 0.015 mm). The ratio $2r_e/P$ of the diameter $2r_e$ of the effective portion and array pitch P was 0.92.

The rod lens array obtained in this way had a conjugation length Tc at wavelengths of 470 nm, 525 nm and 630 nm of substantially the same at 15.6 mm, and a working distance $L_0$ of 3.8 mm.

Figure 14:
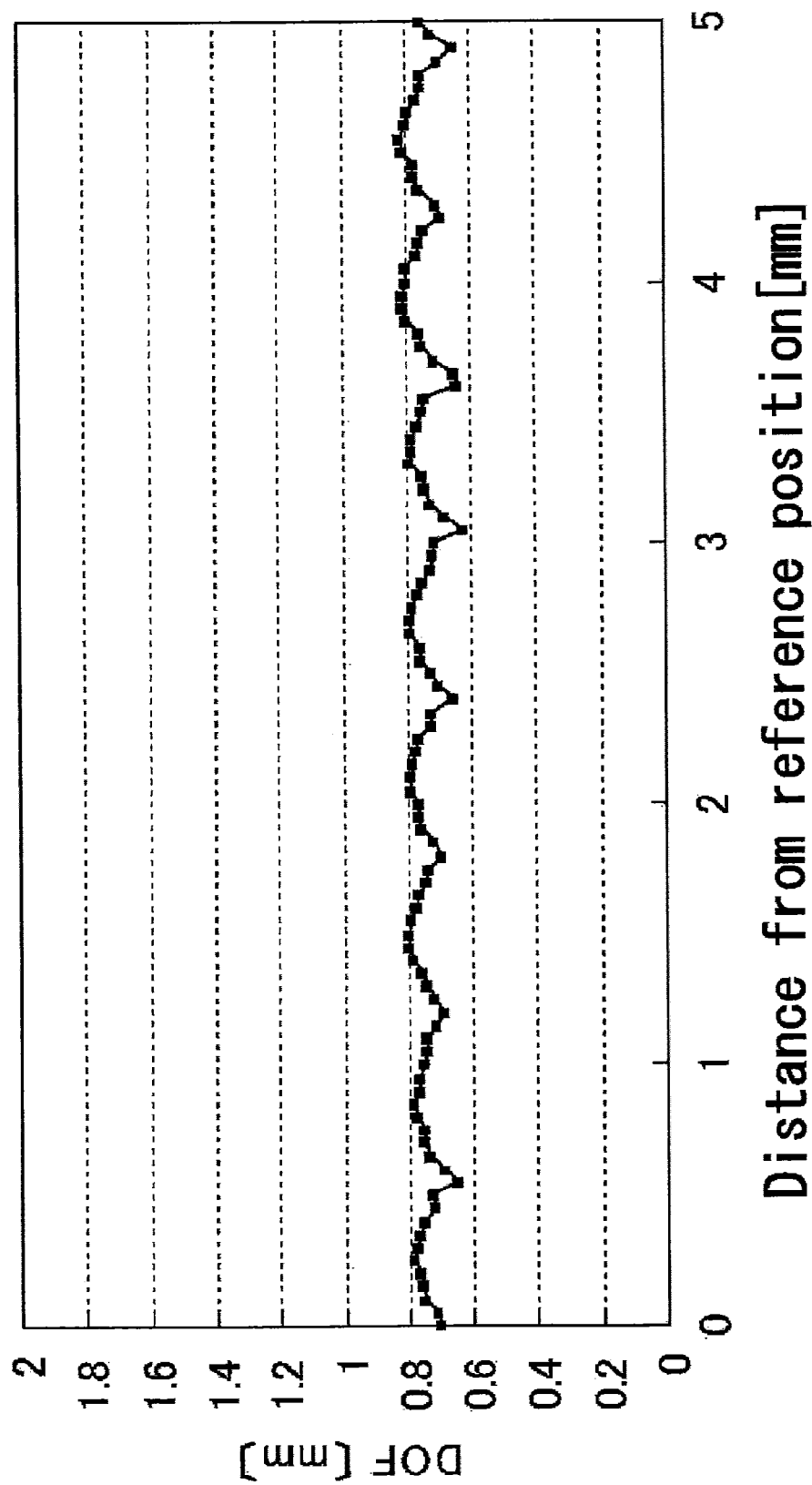
FIG. 14 is a graph showing the focal depth measurement results of a rod lens array of Comparative Example 1 of the present invention.

In addition, the average depth of focus DOFave of the obtained rod lens array was 0.77 mm, the depth of focus irregularity DOFcv was 5.4%, the light intensity was 469%, and the light intensity irregularity was 15%. The measurement results are shown in FIG. 14 and Table 2.

Since the image sensor head was prepared using this rod lens array, a very compact image sensor head could be obtained. In addition, only fuzzy images of low resolution were obtained even when there was little float in the original due to performing reading using this image sensor head, and the irregularity in the images could not be confirmed. In the case of there being no float in the original, the light intensity was very great and thus a clear image was obtained, and irregularity in the image caused by light intensity irregularity was small. In addition, streaked unevenness was not observed in the read image.

Comparative Example 2

A rod lens was prepared in the same way as Comparative Example 1 except for, after the filament after cure processing was drawn 4 times at 145° C., conducting relaxation processing so that the relaxation rate at 127° C. became 0.71.

The radius r of the rod lens obtained in this way was 0.178 mm, the center refractive index $n_0$ was 1.497 at the wavelength of 525 nm, and approximating the refractive index distribution in the range from 0.2r to 0.9r from the center to the outer periphery by a formula relating to the aforementioned refractive index distribution, the refractive index distribution constant g was 0.84 $mm^{-1}$ at the wavelength of 525 nm. In addition, a layer in which dye is mixed was formed from the outer periphery towards the center, the effective radius $r_e$ being 0.166 mm, and the numerical aperture NA of the lens being 0.209.

Using 865 of the obtained rod lenses, a 1-line rod lens array was prepared in which the lens length was 4.4 mm and array pitch P was 0.370 mm (gap between adjacent lenses of 0.015 mm). The ratio $2r_e/P$ of the diameter $2r_e$ of the effective portion and array pitch P was 0.9.

The rod lens array obtained in this way had a conjugation length Tc at wavelengths of 470 nm, 525 nm and 630 nm of substantially the same at 10 mm, and a working distance $L_0$ of 2.8 mm.

Figure 15:
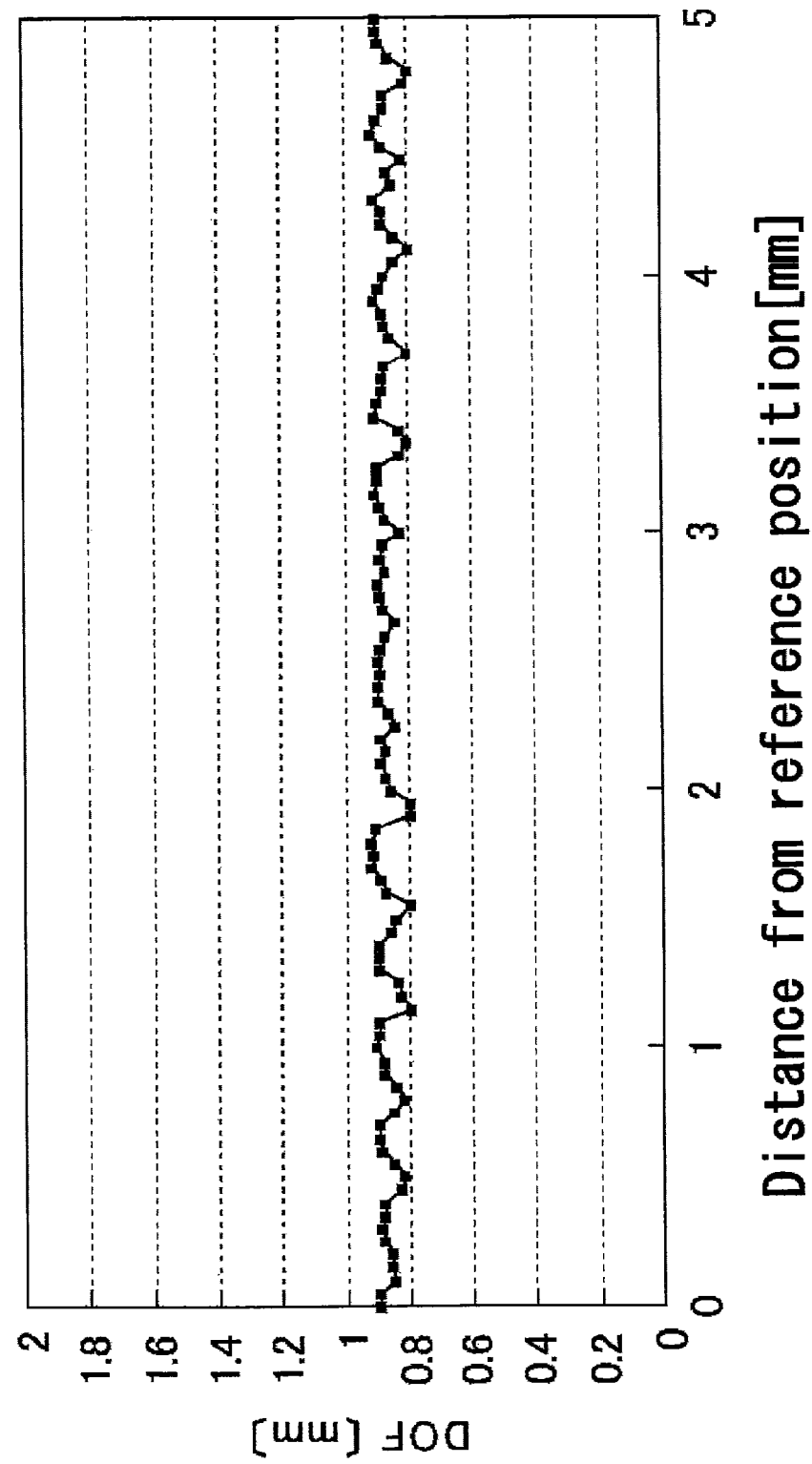
FIG. 15 is a graph showing the focal depth measurement results of a rod lens array of Comparative Example 2 of the present invention.
Figure 16:
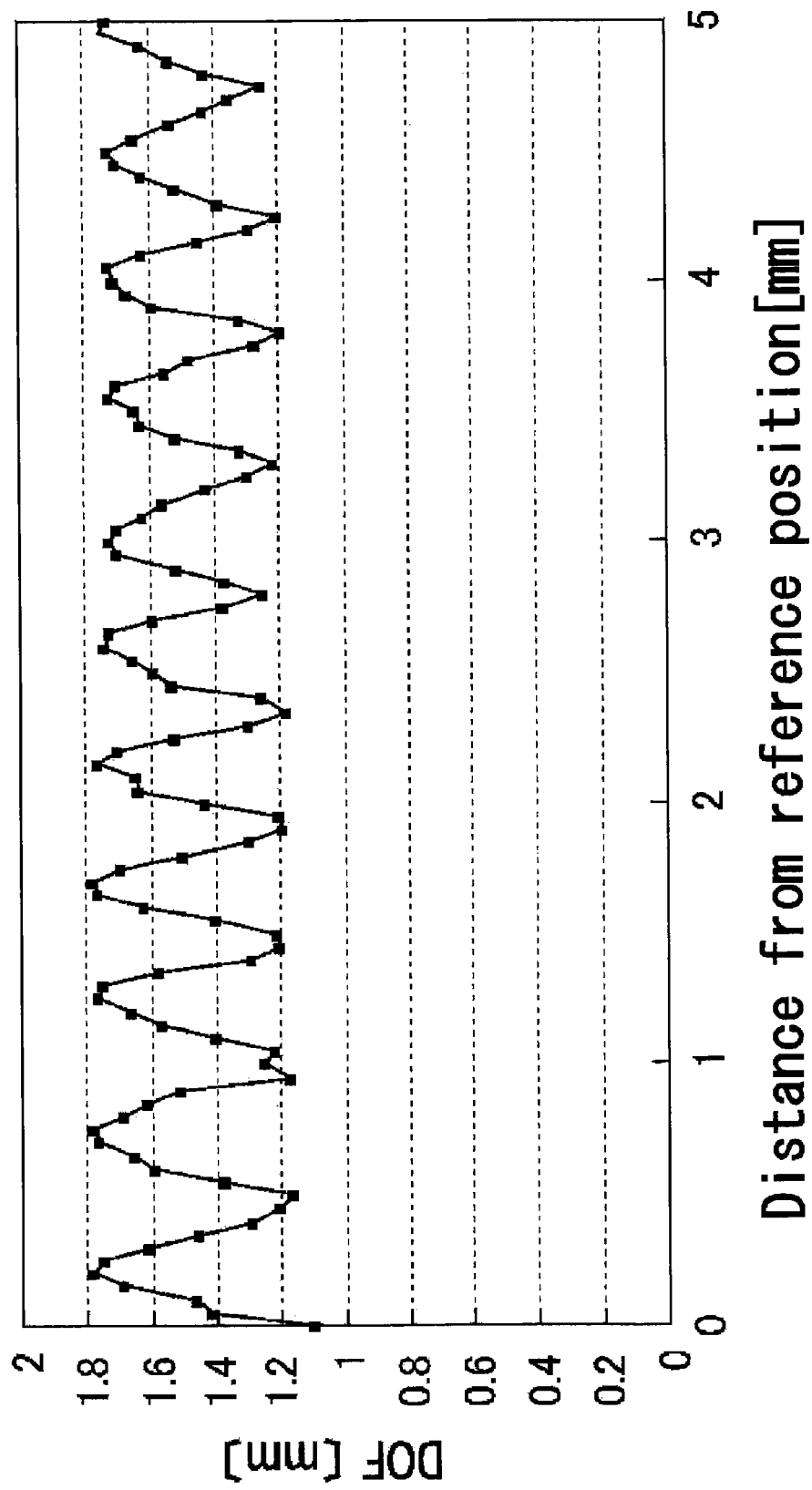
FIG. 16 is a graph showing the focal depth measurement results of a rod lens array of Comparative Example 3 of the present invention.

In addition, the average depth of focus DOFave of the obtained rod lens array was 0.87 mm, and the depth of focus irregularity DOFcv was 3.8%. The light intensity was 385%, and the light intensity irregularity was 12%. The measurement results are shown in FIG. 15 and Table 2.

Upon preparing an image sensor head using this rod lens array, a very compact image sensor head was obtained; however, when performing reading using this image sensor head, the working distance $L_0$ was short at 2.8 mm, and interference with the platen glass occurred; therefore, it was not possible to perform reading well.

Comparative Example 3

A first layer formation stock solution (uncured form material) was made by heating and kneading 52 parts by mass of PMMA, 13 parts by mass of MMA, 35 parts by mass of BzMA, 0.25 parts by mass of HCPK, and 0.1 parts by mass of HQ at 70° C. A second layer formation stock solution (uncured form material) was made by heating and kneading 51 parts by mass of PMMA, 16 parts by mass of MMA, 33 parts by mass of BzMA, 0.25 parts by mass of HCPK and 0.1 parts by mass of HQ at 70° C. A third layer formation stock solution (uncured form material) was made by heating and kneading 50 parts by mass of PMMA, 20 parts by mass of MMA, 30 parts by mass of BzMA, 0.25 parts by mass of HCPK and 0.1 parts by mass of HQ at 70° C. A fourth layer formation stock solution (uncured form material) was made by heating and kneading 50 parts by mass of PMMA, 35 parts by mass of MMA, 15 parts by mass of BzMA, 0.25 parts by mass of HCPK and 0.1 parts by mass of HQ at 70° C. A fifth layer formation stock solution (uncured form material) was made by heating and kneading 42 parts by mass of PMMA, 18 parts by mass of MMA, 40 parts by mass of 8FM, 41 parts by mass of 8FM, 0.25 parts by mass of HCPK and 0.1 parts by mass of HQ at 70° C.

The compositions of the stock solutions of each layer are shown in Table 3.

It should be noted that, with the purpose of suppressing crosstalk light and flare light, 0.01 parts by mass of the dye Blue ACR (manufactured by Nippon Kayaku Co., Ltd.), the dye MS Yellow HD-180 (manufactured by Mitsui Toatsu Dye Ltd.), MS Magenta HM-1450 (manufactured by Mitsui Toatsu Dye Ltd.), and the dye Diaresin Blue 4G (manufactured by Mitsubishi Chemical Corp.) were respectively added relative to the total stock solution into the fourth layer formation stock solution prior to heating and kneading.

These five types of stock solutions were simultaneously extruded from a concentric 5-layer composite spinning nozzle, arranging so that the refractive index after curing would sequentially decrease from the center to the outer periphery. The temperature of the composite spinning nozzle was set to 50° C.

The discharge ratios of respective layers were set to first layer/second layer/third layer/fourth layer/fifth layer=48/14/16/21/1, by converting to the ratio of thickness (radius of first later) of each layer in the radial direction of the rod lens.

Herein, the first layer is the inner most layer, and the fifth layer is the outer most layer.

Next, the rod lens base fiber was manufactured using the manufacturing equipment for the rod lens base fiber made of plastic shown in FIG. 1, from the obtained stock solutions.

More specifically, along with introducing nitrogen gas from the inert gas introduction pipe into the storage body, inert gas inside of the storage body was made to discharge from the inert gas discharge pipe.

In addition, the filament A extruded from the concentric composite spinning nozzle was received (200 cm/min) by the receiving roller (nip roller), and passed the interdiffusion processing part having a length of 30 cm, to cause interdiffusion to occur between each layer.

Then, the filament A was made to pass over the center of the first cure processing part (photoirradiation part) in which eighteen 40 W chemical lamps of 120 cm length are disposed at equal intervals around the central axis to cause to cure while allowing interdiffusion between each layer. Successively, the filament A was made to further cure by passing over the center of the second cure processing part (photoirradiation part) in which three 2 KW high pressure mercury lamps are disposed at equal intervals around the central axis. It should be noted that the nitrogen flow rate in the interdiffusion processing part was set to 72 L/min.

The radius of the rod lens base fiber thereby obtained was 0.30 mm.

Next, the obtained rod lens base fiber was drawn 2.34 times at 145° C., followed by conducting relaxation processing so that the relaxation rate at 127° C. became 0.71, and then cut to lengths of 166 mm to prepare the rod lenses.

The radius r of the rod lens obtained in this way was 0.232 mm, the center refractive index $n_0$ was 1.503 at the wavelength of 525 nm, and approximating the refractive index distribution in the range from 0.2r to 0.8r from the center to the outer periphery by a formula relating to the aforementioned refractive index distribution, the refractive index distribution constant g was 0.40 mm$^{-1}$ at the wavelength of 525 nm. In addition, a layer in which dye is mixed was formed from the outer periphery towards the center, the effective radius $r_e$ being 0.18 mm, and the numerical aperture NA of the lens being 0.108.

Using 690 of the obtained rod lenses, a 1-line rod lens array was prepared in which the lens length was 9.5 mm and array pitch P was 0.464 mm (gap between adjacent lenses of 0 mm). The ratio $2r_e/P$ of the diameter $2r_e$ of the effective portion and array pitch P was 0.78.

The rod lens array obtained in this way had a conjugation length Tc at wavelengths of 470 nm, 525 nm and 630 nm of substantially the same at 19.2 mm, and a working distance $L_0$ of 4.9 mm.

In addition, the average depth of focus DOFave of the obtained rod lens array was 1.51 mm, the depth of focus irregularity DOFcv was 12.8%, the light intensity was 106%, and the light intensity irregularity was 35%. The measurement results are shown in FIG. 15 and Table 2.

Since the image sensor head was prepared using this rod lens array, a compact image sensor head could be obtained. In addition, images of high resolution were obtained even when there was considerable float in the original due to performing reading using this image sensor head; however, due to the irregularity in the focus depth being great, irregularity in the images caused by this was also very great. In the case of there being no float in the original, the light intensity was great and a clear image was obtained; however, the light intensity irregularity was great. In addition, streaked unevenness was clearly observed in the read image.

EXPLANATION OF REFERENCE NUMERALS

50: rod lens array
44: rod lens
52: substrate
54: adhesive

The invention claimed is:

1. A rod lens array comprising at least one line of rod lenses between two substrates, wherein a plurality of columnar rod lenses having a refractive index that decreases from the center towards an outer periphery is arranged so that a central axes of the rod lenses respectively are substantially parallel to each other, wherein an average depth of focus DOFave is at least 0.9 mm, and wherein a depth of focus irregularity DOFcv in a main scanning direction of the line of the rod lenses is no more than 12%.

2. A rod lens array satisfying requirements (1) to (4) below:

$$0.3 \text{ mm}^{-1} \leq g \leq 0.6 \text{ mm}^{-1} \quad (1)$$

$$0.1 \text{ mm} \leq r_e \leq 0.3 \text{ mm} \quad (2)$$

$$NA \leq 0.175 \quad (3)$$

$$0.85 \leq 2r_e/P \leq 1 \quad (4)$$

wherein g represents a refractive index distribution constant of the rod lens, and $r_e$ represents an effective portion serving as a lens function of the rod lens, NA represents a numerical aperture of the rod lens, and P represents a distance between centers of adjacent rod lenses in the rod lens array.

3. An image sensor head comprising the rod lens array according to claim 1.

4. An image sensor head comprising the rod lens array according to claim 2.

* * * * *